US008759820B2

(12) United States Patent
Godo et al.

(10) Patent No.: US 8,759,820 B2
(45) Date of Patent: Jun. 24, 2014

(54) SEMICONDUCTOR DEVICE

(75) Inventors: Hiromichi Godo, Kanagawa (JP); Keisuke Murayama, Kanagawa (JP)

(73) Assignee: Semiconductor Energy Laboratory Co., Ltd., Atsugi-shi, Kanagawa-ken (JP)

( * ) Notice: Subject to any disclaimer, the term of this patent is extended or adjusted under 35 U.S.C. 154(b) by 366 days.

(21) Appl. No.: 13/205,910

(22) Filed: Aug. 9, 2011

(65) Prior Publication Data
US 2012/0043541 A1 Feb. 23, 2012

(30) Foreign Application Priority Data

Aug. 20, 2010 (JP) ................................. 2010-184642

(51) Int. Cl.
*H01L 29/08* (2006.01)
(52) U.S. Cl.
USPC ........... 257/40; 257/59; 257/72; 257/E29.299
(58) Field of Classification Search
USPC ................. 257/40, 59, 72, E29.117, E29.299
See application file for complete search history.

(56) References Cited

U.S. PATENT DOCUMENTS

| 5,731,856 | A | 3/1998 | Kim et al. |
| 5,744,864 | A | 4/1998 | Cillessen et al. |
| 6,294,274 | B1 | 9/2001 | Kawazoe et al. |
| 6,563,174 | B2 | 5/2003 | Kawasaki et al. |
| 6,727,522 | B1 | 4/2004 | Kawasaki et al. |
| 7,049,190 | B2 | 5/2006 | Takeda et al. |
| 7,061,014 | B2 | 6/2006 | Hosono et al. |
| 7,064,346 | B2 | 6/2006 | Kawasaki et al. |
| 7,105,868 | B2 | 9/2006 | Nause et al. |
| 7,211,825 | B2 | 5/2007 | Shih et al |
| 7,282,782 | B2 | 10/2007 | Hoffman et al. |
| 7,297,977 | B2 | 11/2007 | Hoffman et al. |
| 7,323,356 | B2 | 1/2008 | Hosono et al. |
| 7,385,224 | B2 | 6/2008 | Ishii et al. |

(Continued)

FOREIGN PATENT DOCUMENTS

| EP | 1 737 044 A1 | 12/2006 |
| EP | 2 226 847 A2 | 9/2010 |

(Continued)

OTHER PUBLICATIONS

Asakuma, N et al., "Crystallization and Reduction of Sol-Gel-Derived Zinc Oxide Films by Irradiation With Ultraviolet Lamp," Journal of Sol-Gel Science and Technology, 2003, vol. 26, pp. 181-184.

(Continued)

*Primary Examiner* — Minh-Loan T Tran
(74) *Attorney, Agent, or Firm* — Fish & Richardson P.C.

(57) ABSTRACT

An object is to provide a transistor in which light deterioration is suppressed as much as possible and electrical characteristics are stable, and a semiconductor device including the transistor. The attention focuses on the fact that light is reflected by a film used for forming a transistor and multiple interaction occurs. When the optical thickness of the film which causes the reflection is roughly an odd multiple of $\lambda_0/4$ or roughly an even multiple of $\lambda_0/4$, reflectance in a wavelength region of light which is absorbed by an oxide semiconductor is increased without a loss of a function of the film with respect to the transistor, whereby the amount of light absorbed by the oxide semiconductor is reduced and an effect of reducing light deterioration is increased.

24 Claims, 16 Drawing Sheets

(56) References Cited

U.S. PATENT DOCUMENTS

| | | | |
|---|---|---|---|
| 7,402,506 B2 | 7/2008 | Levy et al. | |
| 7,411,209 B2 | 8/2008 | Endo et al. | |
| 7,453,065 B2 | 11/2008 | Saito et al. | |
| 7,453,087 B2 | 11/2008 | Iwasaki | |
| 7,462,862 B2 | 12/2008 | Hoffman et al. | |
| 7,466,294 B2 | 12/2008 | Yamazaki et al. | |
| 7,468,304 B2 | 12/2008 | Kaji et al. | |
| 7,501,293 B2 | 3/2009 | Ito et al. | |
| 7,554,265 B2 | 6/2009 | Godo et al. | |
| 7,674,650 B2 | 3/2010 | Akimoto et al. | |
| 7,732,819 B2 | 6/2010 | Akimoto et al. | |
| 7,791,072 B2 | 9/2010 | Kumomi et al. | |
| 8,536,571 B2 * | 9/2013 | Yamazaki | 257/43 |
| 2001/0046027 A1 | 11/2001 | Tai et al. | |
| 2002/0056838 A1 | 5/2002 | Ogawa | |
| 2002/0132454 A1 | 9/2002 | Ohtsu et al. | |
| 2003/0189401 A1 | 10/2003 | Kido et al. | |
| 2003/0218222 A1 | 11/2003 | Wager, III et al. | |
| 2004/0038446 A1 | 2/2004 | Takeda et al. | |
| 2004/0127038 A1 | 7/2004 | Carcia et al. | |
| 2005/0017302 A1 | 1/2005 | Hoffman | |
| 2005/0199959 A1 | 9/2005 | Chiang et al. | |
| 2006/0035452 A1 | 2/2006 | Carcia et al. | |
| 2006/0043377 A1 | 3/2006 | Hoffman et al. | |
| 2006/0091793 A1 | 5/2006 | Baude et al. | |
| 2006/0108529 A1 | 5/2006 | Saito et al. | |
| 2006/0108636 A1 | 5/2006 | Sano et al. | |
| 2006/0110867 A1 | 5/2006 | Yabuta et al. | |
| 2006/0113536 A1 | 6/2006 | Kumomi et al. | |
| 2006/0113539 A1 | 6/2006 | Sano et al. | |
| 2006/0113549 A1 | 6/2006 | Den et al. | |
| 2006/0113565 A1 | 6/2006 | Abe et al. | |
| 2006/0169973 A1 | 8/2006 | Isa et al. | |
| 2006/0170111 A1 | 8/2006 | Isa et al. | |
| 2006/0197092 A1 | 9/2006 | Hoffman et al. | |
| 2006/0208977 A1 | 9/2006 | Kimura | |
| 2006/0228974 A1 | 10/2006 | Thelss et al. | |
| 2006/0231882 A1 | 10/2006 | Kim et al. | |
| 2006/0238135 A1 | 10/2006 | Kimura | |
| 2006/0244107 A1 | 11/2006 | Sugihara et al. | |
| 2006/0284171 A1 | 12/2006 | Levy et al. | |
| 2006/0284172 A1 | 12/2006 | Ishii | |
| 2006/0292777 A1 | 12/2006 | Dunbar | |
| 2007/0024187 A1 | 2/2007 | Shin et al. | |
| 2007/0046191 A1 | 3/2007 | Saito | |
| 2007/0052025 A1 | 3/2007 | Yabuta | |
| 2007/0054507 A1 | 3/2007 | Kaji et al. | |
| 2007/0090365 A1 | 4/2007 | Hayashi et al. | |
| 2007/0108446 A1 | 5/2007 | Akimoto | |
| 2007/0152217 A1 | 7/2007 | Lai et al. | |
| 2007/0172591 A1 | 7/2007 | Seo et al. | |
| 2007/0187678 A1 | 8/2007 | Hirao et al. | |
| 2007/0187760 A1 | 8/2007 | Furuta et al. | |
| 2007/0194379 A1 | 8/2007 | Hosono et al. | |
| 2007/0252928 A1 | 11/2007 | Ito et al. | |
| 2007/0272922 A1 | 11/2007 | Kim et al. | |
| 2007/0287296 A1 | 12/2007 | Chang | |
| 2008/0006877 A1 | 1/2008 | Mardilovich et al. | |
| 2008/0038882 A1 | 2/2008 | Takechi et al. | |
| 2008/0038929 A1 | 2/2008 | Chang | |
| 2008/0050595 A1 | 2/2008 | Nakagawara et al. | |
| 2008/0073653 A1 | 3/2008 | Iwasaki | |
| 2008/0083950 A1 | 4/2008 | Pan et al. | |
| 2008/0106191 A1 | 5/2008 | Kawase | |
| 2008/0128689 A1 | 6/2008 | Lee et al. | |
| 2008/0129195 A1 | 6/2008 | Ishizaki et al. | |
| 2008/0166834 A1 | 7/2008 | Kim et al. | |
| 2008/0182358 A1 | 7/2008 | Cowdery-Corvan et al. | |
| 2008/0224133 A1 | 9/2008 | Park et al. | |
| 2008/0254569 A1 | 10/2008 | Hoffman et al. | |
| 2008/0258139 A1 | 10/2008 | Ito et al. | |
| 2008/0258140 A1 | 10/2008 | Lee et al. | |
| 2008/0258141 A1 | 10/2008 | Park et al. | |
| 2008/0258143 A1 | 10/2008 | Kim et al. | |
| 2008/0296568 A1 | 12/2008 | Ryu et al. | |
| 2009/0068773 A1 | 3/2009 | Lai et al. | |
| 2009/0073325 A1 | 3/2009 | Kuwabara et al. | |
| 2009/0114910 A1 | 5/2009 | Chang | |
| 2009/0134399 A1 | 5/2009 | Sakakura et al. | |
| 2009/0152506 A1 | 6/2009 | Umeda et al. | |
| 2009/0152541 A1 | 6/2009 | Maekawa et al. | |
| 2009/0278122 A1 | 11/2009 | Hosono et al. | |
| 2009/0280600 A1 | 11/2009 | Hosono et al. | |
| 2010/0065844 A1 | 3/2010 | Tokunaga | |
| 2010/0092800 A1 | 4/2010 | Itagaki et al. | |
| 2010/0109002 A1 | 5/2010 | Itagaki et al. | |

FOREIGN PATENT DOCUMENTS

| | | |
|---|---|---|
| JP | 60-198861 A | 10/1985 |
| JP | 63-210022 A | 8/1988 |
| JP | 63-210023 A | 8/1988 |
| JP | 63-210024 A | 8/1988 |
| JP | 63-215519 A | 9/1988 |
| JP | 63-239117 A | 10/1988 |
| JP | 63-265818 A | 11/1988 |
| JP | 05-251705 A | 9/1993 |
| JP | 08-264794 A | 10/1996 |
| JP | 11-505377 A | 5/1999 |
| JP | 2000-044236 A | 2/2000 |
| JP | 2000-150900 A | 5/2000 |
| JP | 2002-076356 A | 3/2002 |
| JP | 2002-289859 A | 10/2002 |
| JP | 2003-086000 A | 3/2003 |
| JP | 2003-086808 A | 3/2003 |
| JP | 2004-103957 A | 4/2004 |
| JP | 2004-273614 A | 9/2004 |
| JP | 2004-273732 A | 9/2004 |
| JP | 2006-165528 A | 6/2006 |
| WO | 2004/114391 A1 | 12/2004 |

OTHER PUBLICATIONS

Asaoka, Y et al., "29.1: Polarizer-Free Reflective LCD Combined with Ultra Low-Power Driving Technology," SID Digest '09: SID International Symposium Digest of Technical Papers, 2009, pp. 395-398.

Chern, H et al., "An Analytical Model for the Above-Threshold Characteristics of Polysilicon Thin-Film Transistors," IEEE Transactions on Electron Devices, Jul. 1, 1995, vol. 42, No. 7, pp. 1240-1246.

Cho, D et al., "21.2: Al and Sn-Doped Zinc Indium Oxide Thin Film Transistors for AMOLED Back-Plane," SID Digest '09: SID International Symposium Digest of Technical Papers, May 31, 2009, pp. 280-283.

Clark, S et al., "First Principles Methods Using Castep," Zeitschrift fur Kristallographie, 2005, vol. 220, pp. 567-570.

Coates. D et al., Optical Studies of the Amorphous Liquid-Cholesteric Liquid Crystal Transition: The "Blue Phase," Physics Letters, Sep. 10, 1973, vol. 45A, No. 2, pp. 115-116.

Costello, M et al., "Electron Microscopy of a Cholesteric Liquid Crystal and Its Blue Phase," Phys. Rev. A (Physical Review. A), May 1, 1984, vol. 29, No. 5, pp. 2957-2959.

Dembo, H et al., "RFCPUS on Glass and Plastic Substrates Fabricated by TFT Transfer Technology," IEDM 05: Technical Digest of International Electron Devices Meeting, Dec. 5, 2005, pp. 1067-1069.

Fortunato, E et al., "Wide-Bandgap High-Mobility ZnO Thin-Film Transistors Produced At Room Temperature," Appl. Phys. Lett. (Applied Physics Letters), Sep. 27, 2004, vol. 85, No. 13, pp. 2541-2543.

Fung, T et al., "2-D Numerical Simulation of High Performance Amorphous In-Ga-Zn-O TFTs for Flat Panel Displays," AM-FPD '08 Digest of Technical Papers, Jul. 2, 2008, pp. 251-252, The Japan Society of Applied Physics.

Godo, H et al., "P-9: Numerical Analysis on Temperature Dependence of Characteristics of Amorphous In-Ga-Zn-Oxide TFT," SID Digest '09: SID International Symposium Digest of Technical Papers, May 31, 2009, pp. 1110-1112.

(56) References Cited

OTHER PUBLICATIONS

Godo, H et al., "Temperature Dependence of Characteristics and Electronic Structure for Amorphous In-Ga-Zn-Oxide TFT," AM-FPD '09 Digest of Technical Papers, Jul. 1, 2009, pp. 41-44.

Hayashi, Ret al., "42.1: Invited Paper: Improved Amorphous In-Ga-Zn-O TFTs," SID Digest '08: SID International Symposium Digest of Technical Papers, May 20, 2008, vol. 39, pp. 621-624.

Hirao, T et al., "Novel Top-Gate Zinc Oxide Thin-Film Transistors (ZnO TFTs) for AMLCDs," Journal of the SID, 2007, vol. 15, No. 1, pp. 17-22.

Hosono, H et al., "Working hypothesis to explore novel wide band gap electrically conducting amorphous oxides and examples," J. Non-Cryst. Solids (Journal of Non-Crystalline Solids), 1996, vol. 198-200, pp. 165-169.

Hosono, H, "68.3: Invited Paper: Transparent Amorphous Oxide Semiconductors for High Performance TFT," SID Digest '07: SID International Symposium Digest of Technical Papers, 2007, vol. 38, pp. 1830-1833.

Hsieh, H et al., "P-29: Modeling of Amorphous Oxide Semiconductor Thin Film Transistors and Subgap Density of States," SID Digest '08: SID International Symposium Digest of Technical Papers, 2008, vol. 39, pp. 1277-1280.

Ikeda, T et al., "Full-Functional System Liquid Crystal Display Using CG-Silicon Technology," SID Digest '04: SID International Symposium Digest of Technical Papers, 2004, vol. 35, pp. 860-863.

Janotti, A et al., "Native Point Defects in ZnO," Phys. Rev. B (Physical Review. B), 2007, vol. 76, No. 16, pp. 165202-1-165202-22.

Janotti, A et al., "Oxygen Vacancies in ZnO," Appl. Phys. Lett. (Applied Physics Letters), 2005, vol. 87, pp. 122102-1-122102-3.

Jeong, J et al., "3.1: Distinguished Paper: 12.1-Inch WXGA AMOLED Display Driven by Indium-Gallium-Zinc Oxide TFTs Array," SID Digest '08: SID International Symposium Digest of Technical Papers, May 20, 2008, vol. 39, No. 1, pp. 1-4.

Jin, D et al., "65.2: Distinguished Paper: World-Largest (6.5") Flexible Full Color Top Emission AMOLED Display on Plastic Film and Its Bending Properties," SID Digest '09: SID International Symposium Digest of Technical Papers, May 31, 2009, pp. 983-985.

Kanno, H et al., "White Stacked Electrophosphorecent Organic Light-Emitting Devices Employing MOO3 As a Charge-Generation Layer," Adv. Mater. (Advanced Materials), 2006, vol. 18, No. 3, pp. 339-342.

Kikuchi, H et al., "39.1: Invited Paper: Optically Isotropic Nano-Structured Liquid Crystal Composites for Display Applications," SID Digest '09: SID International Symposium Digest of Technical Papers, May 31, 2009, pp. 578-581.

Kikuchi, H et al., "62.2: Invited Paper: Fast Electro-Optical Switching in Polymer-Stabilized Liquid Crystalline Blue Phases for Display Application," SID Digest '07: SID International Symposium Digest of Technical Papers, 2007, vol. 38, pp. 1737-1740.

Kikuchi, H et al., "Polymer-Stabilized Liquid Crystal Blue Phases," Nature Materials, Sep. 1, 2002, vol. 1, pp. 64-68.

Kim, S et al., "High-Performance oxide thin film transistors passivated by various gas plasmas," The Electrochemical Society, 214th ECS Meeting, 2008, No. 2317, 1 page.

Kimizuka, N et al., "Spinel,YBFE2O4, and YB2FE3O7 Types of Structures for Compounds in the In2O3 and Sc2O3-A2O3-BO Systems [A; Fe, Ga, or Al; B: Mg, Mn, Fe, Ni, Cu, or Zn] At Temperatures Over 1000° C," Journal of Solid State Chemistry, 1985, vol. 60, pp. 382-384.

Kimizuka, N et al., "Syntheses and Single-Crystal Data of Homologous Compounds, In2O3(ZnO)m (m=3, 4, and 5), InGaO3(ZnO)3, and Ga2O3(ZnO)m (m=7, 8, 9, and 16) in the In2O3-ZnGa2O4-ZnO System," Journal of Solid State Chemistry, Apr. 1, 1995, vol. 116, No. 1, pp. 170-178.

Kitzerow, H et al., "Observation of Blue Phases in Chiral Networks," Liquid Crystals, 1993, vol. 14, No. 3, pp. 911-916.

Kurokawa, Y et al., "UHF RFCPUS on Flexible and Glass Substrates for Secure RFID Systems," Journal of Solid-State Circuits, 2008, vol. 43, No. 1, pp. 292-299.

Lany, S et al., "Dopability, Intrinsic Conductivity, and Nonstoichiometry of Transparent Conducting Oxides," Phys. Rev. Lett. (Physical Review Letters), Jan. 26, 2007, vol. 98, pp. 045501-1-045501-4.

Lee, H et al., "Current Status of, Challenges to, and Perspective View of AM-OLED," IDW '06: Proceedings of the 13th International Display Workshops, Dec. 7, 2006, pp. 663-666.

Lee, J et al., "World's Largest (15-Inch) XGA AMLCD Panel Using IGZO Oxide TFT," SID Digest '08: SID International Symposium Digest of Technical Papers, May 20, 2008, vol. 39, pp. 625-628.

Lee, M et al., "15.4: Excellent Performance of Indium-Oxide-Based Thin-Film Transistors by DC Sputtering," SID Digest '09: SID International Symposium Digest of Technical Papers, May 31, 2009, pp. 191-193.

Li, C et al "Modulated Structures of Homologous Compounds InMO3(ZnO)m (M=In,Ga; m=Integer) Described by Four-Dimensional Superspace Group," Journal of Solid State Chemistry, 1998, vol. 139, pp. 347-355.

Masuda, S et al., "Transparent thin film transistors using ZnO as an active channel layer and their electrical properties," J. Appl. Phys. (Journal of Applied Physics), Feb. 1, 2003, vol. 93, No. 3, pp. 1624-1630.

Meiboom, S et al., "Theory of the Blue Phase of Cholesteric Liquid Crystals," Phys. Rev. Lett. (Physical Review Letters), May 4, 1981, vol. 46, No. 18, pp. 1216-1219.

Miyasaka, M, "SUFTLA Flexible Microelectronics on Their Way to Business," SID Digest '07: SID International Symposium Digest of Technical Papers, 2007, vol. 38, pp. 1673-1676.

Mo, Y et al., "Amorphous Oxide TFT Backplanes for Large Size AMOLED Displays," IDW '08: Proceedings of the 6th International Display Workshops, Dec. 3, 2008, pp. 581-584.

Nakamura, "Synthesis of Homologous Compound with New Long-Period Structure,"0 NIRIM Newsletter, Mar. 1995, vol. 150, pp. 1-4 with English translation.

Nakamura, M et al., "The phase relations in the In2O3-Ga2ZnO4-ZnO system at 1350° C," Journal of Solid State Chemistry, Aug. 1, 1991, vol. 93, No. 2, pp. 298-315.

Nomura, K et al., "Thin-Film Transistor Fabricated in Single-Crystalline Transparent Oxide Semiconductor," Science, May 23, 2003, vol. 300, No. 5623, pp. 1269-1272.

Nomura, K et al., "Amorphous Oxide Semiconductors for High-Performance Flexible Thin-Film Transistors,"Jpn. J. Appl. Phys. (Japanese Journal of Applied Physics), 2006, vol. 45, No. 5B, pp. 4303-4308.

Nomura, K et al., "Room-Temperature Fabrication of Transparent Flexible Thin-Film Transistors Using Amorphous Oxide Semiconductors," Nature, Nov. 25, 2004, vol. 432, pp. 488-492.

Nomura, K et al., "Carrier transport in transparent oxide semiconductor with intrinsic structural randomness probed using single-crystalline InGaO3(ZnO)5 films," Appl. Phys. Lett. (Applied Physics Letters), Sep. 13, 2004, vol. 85, No. 11, pp. 1993-1995.

Nowatari, H et al., "60.2: Intermediate Connector With Suppressed Voltage Loss for White Tandem OLEDs," SID Digest '09: SID International Symposium Digest of Technical Papers, May 31, 2009, vol. 40, pp. 899-902.

Oba, F et al., "Defect energetics in ZnO: A hybrid Hartree-Fock density functional study," Phys. Rev. B (Physical Review. B), 2008, vol. 77, pp. 245202-1-245202-6.

Oh, M et al., "Improving the Gate Stability of ZnO Thin-Film Transistors With Aluminum Oxide Dielectric Layers," J. Electrochem. Soc. (Journal of the Electrochemical Society), 2008, vol. 155, No. 12, pp. H1009-H1014.

Ohara, H et al., "21.3: 4.0 In. QVGA AMOLED Display Using In-Ga-Zn-Oxide TFTs With a Novel Passivation Layer," SID Digest '09: SID International Symposium Digest of Technical Papers, May 31, 2009, pp. 284-287.

Ohara, H et al., "Amorphous In-Ga-Zn-Oxide TFTs with Suppressed Variation for 4.0 inch QVGA AMOLED Display," AM-FPD '09 Digest of Technical Papers, Jul. 1, 2009, pp. 227-230, The Japan Society of Applied Physics.

Orita, M et al., "Amorphous transparent conductive oxide InGaO3(ZnO)m (m<4):a Zn4s conductor," Philosophical Magazine, 2001, vol. 81, No. 5, pp. 501-515.

(56) References Cited

OTHER PUBLICATIONS

Orita, M et al., "Mechanism of Electrical Conductivity of Transparent InGaZnO4," Phys. Rev. B (Physical Review. B), Jan. 15, 2000, vol. 61, No. 3, pp. 1811-1816.

Osada, T et al., "15.2: Development of Driver-Integrated Panel using Amorphous In-Ga-Zn-Oxide TFT," SID Digest '09: SID International Symposium Digest of Technical Papers, May 31, 2009, pp. 184-187.

Osada, T et al., "Development of Driver-Integrated Panel Using Amorphous In-Ga-Zn-Oxide TFT," AM-FPD '09 Digest of Technical Papers, Jul. 1, 2009, pp. 33-36.

Park, J et al., "Dry etching of ZnO films and plasma-induced damage to optical properties," J. Vac. Sci. Technol. B (Journal of Vacuum Science & Technology B), Mar. 1, 2003, vol. 21, No. 2, pp. 800-803.

Park, J et al., "Improvements in the Device Characteristics of Amorphous Indium Gallium Zinc Oxide Thin-Film Transistors by Ar Plasma Treatment," Appl. Phys. Lett. (Applied Physics Letters), Jun. 26, 2007, vol. 90, No. 26, pp. 262106-1-262106-3.

Park, J et al., "Electronic Transport Properties of Amorphous Indium-Gallium-Zinc Oxide Semiconductor Upon Exposure to Water," Appl. Phys. Lett. (Applied Physics Letters), 2008, vol. 92, pp. 072104-1-072104-3.

Park, J et al., "High performance amorphous oxide thin film transistors with self-aligned top-gate structure," IEDM 09: Technical Digest of International Electron Devices Meeting, Dec. 7, 2009, pp. 191-194.

Park, Sang-Hee et al., 42.3: "Transparent ZnO Thin Film Transistor for the Application of High Aperture Ratio Bottom Emission AM-OLED Display," SID Digest '08: SID International Symposium Digest of Technical Papers, May 20, 2008, vol. 39, pp. 629-632.

Park, J et al., "Amorphous Indium-Gallium-Zinc Oxide TFTs and Their Application for Large Size AMOLED," AM-FPD '08 Digest of Technical Papers, Jul. 2, 2008, pp. 275-278.

Park, S et al., "Challenge to Future Displays: Transparent AM-OLED Driven by Peald Grown ZnO TFT," IMID '07 Digest, 2007, pp. 1249-1252.

Prins, M et al., "A Ferroelectric Transparent Thin-Film Transistor," Appl. Phys. Lett. (Applied Physics Letters), Jun. 17, 1996, vol. 68, No. 25, pp. 3650-3652.

Sakata, J et al., "Development of 4.0-In. AMOLED Display With Driver Circuit Using Amorphous In-Ga-Zn-Oxide TFTs," IDW '09: Proceedings of the 16TH International Display Workshops, 2009, pp. 689-692.

Son, K et al., "42.4L: Late-News Paper: 4 Inch QVGA AMOLED Driven by the Threshold Voltage Controlled Amorphous GIZO ($Ga_2O_3$-$In_2O_3$-ZnO) TFT," SID Digest '08: SID International Symposium Digest of Technical Papers, May 20, 2008, vol. 39, pp. 633-636.

Takahashi, M et al., "Theoretical Analysis of IGZO Transparent Amorphous Oxide Semiconductor," IDW '08: Proceedings of the 15th International Display Workshops, Dec. 3, 2008, pp. 1637-1640.

Tsuda, K et al., "Ultra Low Power Consumption Technologies for Mobile TFT-LCDs," IDW '02: Proceedings of the 9th International Display Workshops, Dec. 4, 2002, pp. 295-298.

Ueno, K et al., "Field-Effect Transistor on $SrTiO_3$ with Sputtered $Al_2O_3$ Gate Insulator," Appl. Phys. Lett. (Applied Physics Letters), Sep. 1, 2003, vol. 83, No. 9, pp. 1755-1757.

Van De Walle, C, "Hydrogen as a Cause of Doping in Zinc Oxide," Phys. Rev. Lett. (Physical Review Letters), Jul. 31, 2000, vol. 85, No. 5, pp. 1012-1015.

* cited by examiner

SEMICONDUCTOR DEVICE

BACKGROUND OF THE INVENTION

1. Field of the Invention

The present invention relates to a transistor and a semiconductor device at least part of which includes the transistor.

In this specification, a semiconductor device means all types of devices which can function by utilizing semiconductor characteristics, and an electro-optical device such as a liquid crystal display device, a semiconductor circuit, and an electronic device are all semiconductor devices.

2. Description of the Related Art

Although transistors including silicon semiconductors have been used for conventional display devices typified by liquid crystal televisions, oxide semiconductors have attracted attention as a material which replaces silicon semiconductors. For example, an active matrix display device, in which an amorphous oxide including indium (In), gallium (Ga), and zinc (Zn) is used for an active layer of a transistor and the electron carrier concentration of the amorphous oxide is lower than $10^{18}/cm^3$, is disclosed (see Patent Document 1).

However, some problems of a transistor including an oxide semiconductor have been pointed out. One of the problems is stability of characteristics, and it is pointed out that electrical characteristics are changed by irradiation with visible light or ultraviolet light.

REFERENCE

[Patent Document 1] Japanese Published Patent Application No. 2006-165528

SUMMARY OF THE INVENTION

An oxide semiconductor formed using a metal oxide has a band gap of approximately 3 eV and originally transmits visible light. However, it is known that electrical characteristics of an oxide semiconductor formed using a metal oxide are changed when the oxide semiconductor is irradiated with strong light (the deterioration is called light deterioration).

Any method for improving such a change in the characteristics caused by light in a transistor including an oxide semiconductor has not been proposed, which causes a delay in practical use of the oxide semiconductor which is expected as a new material.

An object of one embodiment of the present invention is to provide a transistor in which light deterioration is suppressed as much as possible and electrical characteristics are stable, and a semiconductor device including the transistor.

According to one embodiment of the present invention, a semiconductor device includes a plurality of layers including a channel portion formed using an oxide semiconductor layer. The optical thickness of a layer located at a middle of three consecutive layers is roughly an odd multiple of $\lambda_0/4$ when the layer located at the middle of the three consecutive layers of the plurality of layers is provided in an optical path of light in a wavelength $\lambda_0$ with which the channel portion can be irradiated along a normal direction of a film plane of the oxide semiconductor layer, and includes a property of transmitting light in the wavelength $\lambda_0$, and a refractive index of the layer located at the middle of the three consecutive layers has a maximum value or a minimum value among refractive indexes of the three consecutive layers.

According to one embodiment of the present invention, a semiconductor device includes a plurality of layers including a channel portion formed using an oxide semiconductor layer. The optical thickness of a layer located at a middle of three consecutive layers is roughly an even multiple of $\lambda_0/4$ when the layer located at the middle of the three consecutive layers of the plurality of layers is provided in an optical path of light in a wavelength $\lambda_0$ with which the channel portion can be irradiated along a normal direction of a film plane of the oxide semiconductor layer, and includes a property of transmitting light in the wavelength $\lambda_0$, and is in contact with a layer having a highest refractive index and a layer having a lowest refractive index among refractive indexes of the three consecutive layers.

According to one embodiment, a semiconductor device includes a plurality of layers including a channel portion formed using an oxide semiconductor layer. The optical thickness of a layer located at a middle of three consecutive layers is roughly an odd multiple of $\lambda_0/4$ when the layer located at the middle of the three consecutive layers of the plurality of layers is provided in an optical path of light in a wavelength $\lambda_0$ with which the channel portion is irradiated along a normal direction of a film plane of the oxide semiconductor layer, and includes a property of transmitting light in the wavelength $\lambda_0$, and a refractive index of the layer located at the middle of the three consecutive layers has a maximum value or a minimum value among refractive indexes of the three consecutive layers. The optical thickness of the layer located at the middle of the three consecutive layers is roughly an even multiple of $\lambda_0/4$ when the layer located at the middle of the three consecutive layers of the plurality of layers is provided in the optical path of the light in the wavelength $\lambda_0$ with which the channel portion is irradiated along the normal direction of the film plane of the oxide semiconductor layer, and includes the property of transmitting light in the wavelength $\lambda_0$, and is in contact with a layer having a highest refractive index and a layer having a lowest refractive index among the refractive indexes of the three consecutive layers.

In the above structure, the layer located at the middle of the three consecutive layers is provided over a substrate.

In the above structure, the layer located at the middle of the three consecutive layers is formed using an insulator or a conductor.

In the above structure, the wavelength $\lambda_0$ is a peak wavelength of a spectrum calculated by multiplying a spectral intensity of external light by a light absorption coefficient of the oxide semiconductor layer.

In the above structure, the wavelength lies within a range of from 300 nm to 450 nm.

According to one embodiment of the present invention, it is possible to provide a transistor which hardly deteriorates owing to light irradiation and has stable electrical characteristics and a semiconductor device including the transistor.

DETAILED DESCRIPTION OF THE INVENTION

Hereinafter, embodiments of the present invention will be described with reference to the accompanying drawings. However, the present invention can be carried out in many different modes, and it is easily understood by those skilled in the art that modes and details of the present invention can be modified in various ways without departing from the spirit and scope of the present invention. Therefore, the present invention is not construed as being limited to description of the embodiments.

Figure 1:
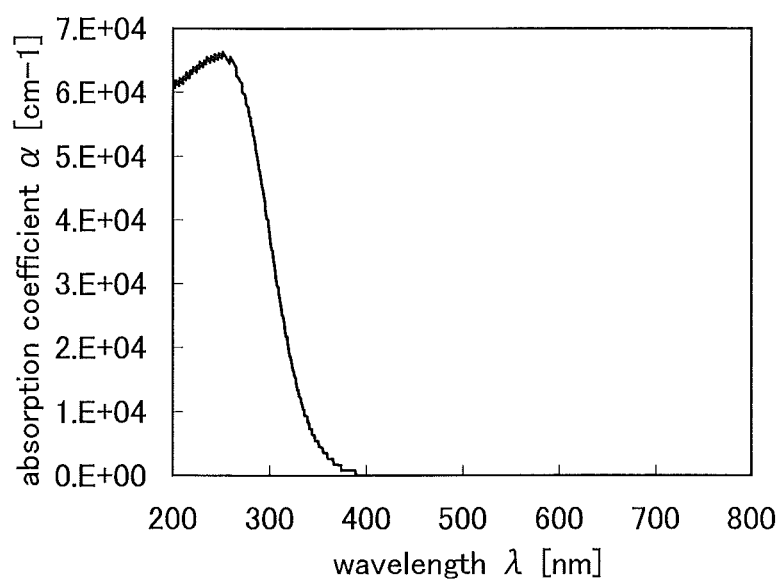
FIG. 1 shows an example a light absorption coefficient of an oxide semiconductor.

The present inventors have found that an oxide semiconductor absorbs light in a wavelength region of 300 nm to 450 nm as in FIG. 1 when the oxide semiconductor is irradiated with light. In other words, a channel portion of a transistor including the oxide semiconductor absorbs light in this wavelength region, so that light deterioration occurs. Thus, a structure in which a channel portion formed using an oxide semiconductor layer does not absorb light in a wavelength region of 300 nm to 450 nm but reflects the light has been thought. In other words, they have focused on the fact that light is reflected by a film used for forming a transistor and multiple interaction occurs. It has been found that reflectance of light in a given wavelength region can be increased when the thickness of a film that causes reflection is set to a given thickness.

Examples of light with which the channel portion formed using the oxide semiconductor layer is irradiated include external light such as sunlight or fluorescent light. Here, an influence of sunlight with a wavelength of less than or equal to 300 nm is small because there is almost no wavelength of less than or equal to 300 nm as the spectral intensity of sunlight on the surface of the earth.

An oxide semiconductor has a band gap of approximately 3 eV and originally transmits visible light. However, because of an influence of trap levels or the like due to an impurity or the like, part of light in a visible light range can be absorbed in some cases. The wavelength region of light which is absorbed is different depending on an oxide semiconductor; a wavelength may be less than or equal to 450 nm with a margin.

Reflection when light passes through a plurality of layers occurs in the case where light passes through the interface between layers having different refractive indexes which are stacked. Such a layered structure is often seen when transistors are formed. A typical example is a layered structure of a silicon oxide film and a silicon nitride film. When there is such a difference of refractive indexes between the silicon oxide film and the silicon nitride film, an effect of multiple interaction by light reflection appears.

Note that in the present invention, even when a plurality of films which is in contact with each other is formed by different steps, the plurality of films is optically considered as the same layer as long as the plurality of films is formed using the same material, a material having the same refractive index, or materials having similar refractive indexes. "Similar refractive indexes" may be refractive indexes having a difference of less than or equal to 2% of a refractive index in a given wavelength. In addition, physical thickness (also referred to as physical film thickness) is the real thickness of a film to be focused on; optical thickness (also referred to as optical film thickness) is calculated by multiplying the physical thickness by a refractive index of the film in a wavelength of the light on the assumption that light in a given wavelength passes through the film.

Figure 2:
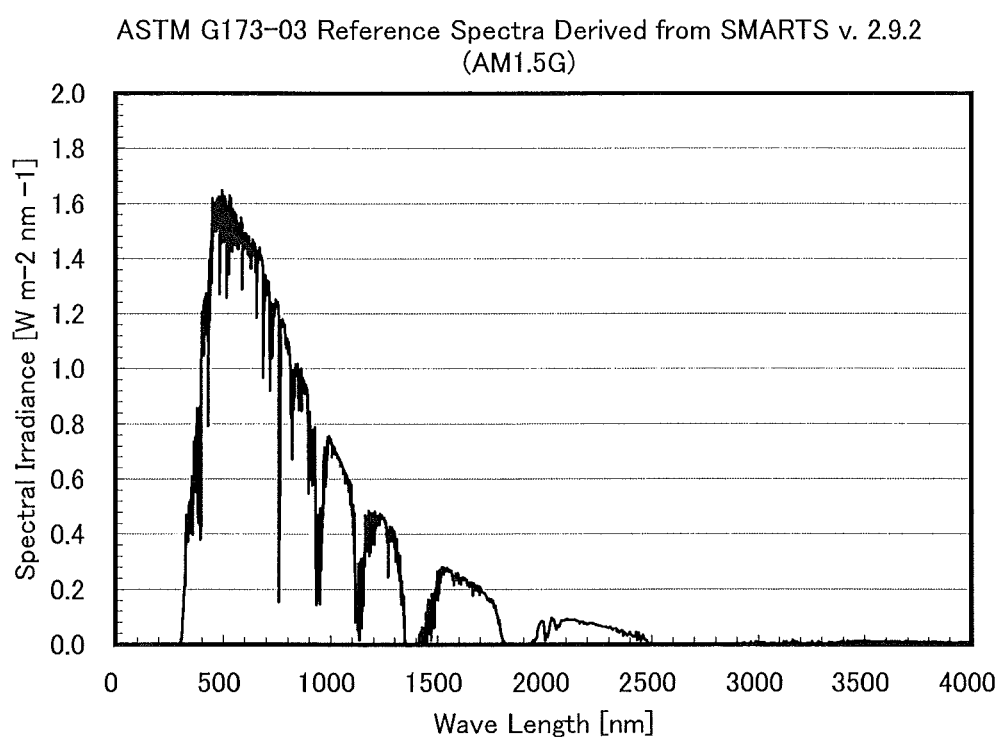
FIG. 2 shows an example of solar spectrum.
Figure 3:
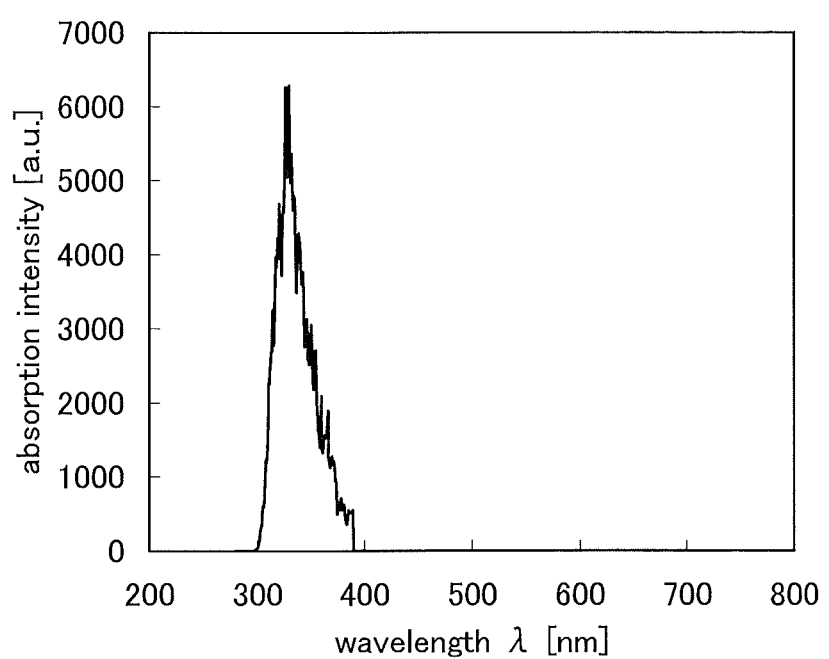
FIG. 3 shows an example of light absorption peak of an oxide semiconductor.

FIG. 1 illustrates an example of wavelength dependence of the absorption coefficient of light which is absorbed by an oxide semiconductor; this absorption coefficient has a unique value depending on the oxide semiconductor to be used. In other words, a wavelength region which causes light deterioration varies according to the oxide semiconductor to be used. Accordingly, a wavelength $\lambda_0$ used in the present invention may be freely selected by a practitioner in the range of from 300 nm to 450 nm in terms of a relation between light absorption coefficient in the oxide semiconductor and deterioration of the wavelength of light with which the oxide semiconductor is irradiated. In particular, a high effect is obtained when a peak wavelength of a spectrum calculated by the product of a spectral distribution of sunlight on the surface of the earth as external light and light absorption coefficient of the oxide semiconductor is used as the wavelength $\lambda_0$. For example, FIG. 2 shows AM 1.5 G as the spectral distribution of sunlight. FIG. 3 shows a spectrum which is obtained by multiplying the spectral distribution of sunlight by the absorption coefficient of FIG. 1. It is found that a peak appears in the vicinity of 330 nm.

In a semiconductor device, a material to be used is limited because of insulating properties, film quality, blocking performance, compatibility with a semiconductor layer, or the like, and a layered structure in which approximately two kinds of materials are necessarily repeated is formed in many cases.

Figure 4:
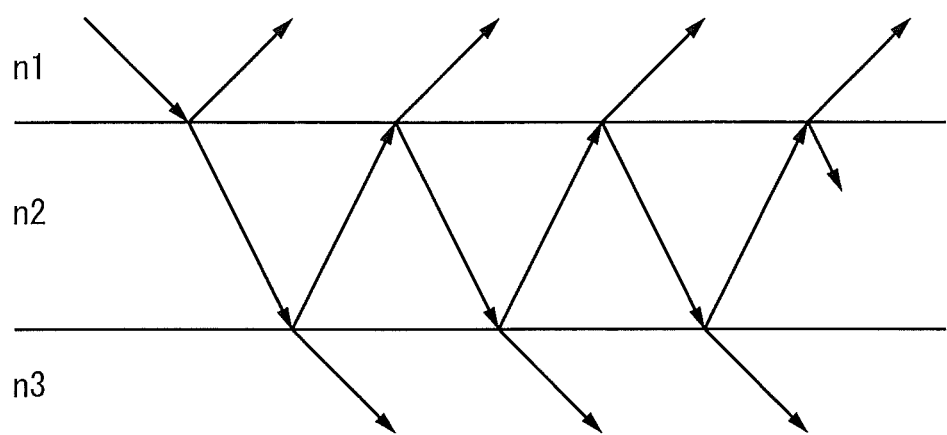
FIG. 4 illustrates an example of reflection in the case of a single film.

First, a reflectance R of a single-layer film as in FIG. 4 is calculated by a method of a Fresnel coefficient for simplicity. FIG. 4 illustrates the case where a layer having a refractive index n1, a layer having a refractive index n2, and a layer having a refractive index n3 are stacked in that order and light is incident on the layer having a refractive index n2 from the layer having a refractive index n1. The light is divided into reflected light and transmitted light at each interface.

When only the case of normal incidence is considered for more simplification, the reflectance R is expressed by Mathematical Formula 1, where $\delta_2$ represents a phase variation.

[Mathematical Formula 1]

$$R = 1 - \frac{8n1n2^2n3}{(n1^2+n2^2)(n2^2+n3^2)+4n1n2^2n3+(n1^2-n2^2)(n2^2-n3^2)\cos2\delta_2}, \quad 2\delta_2 = \frac{4\pi}{\lambda_0}n2d$$

Figure 5:
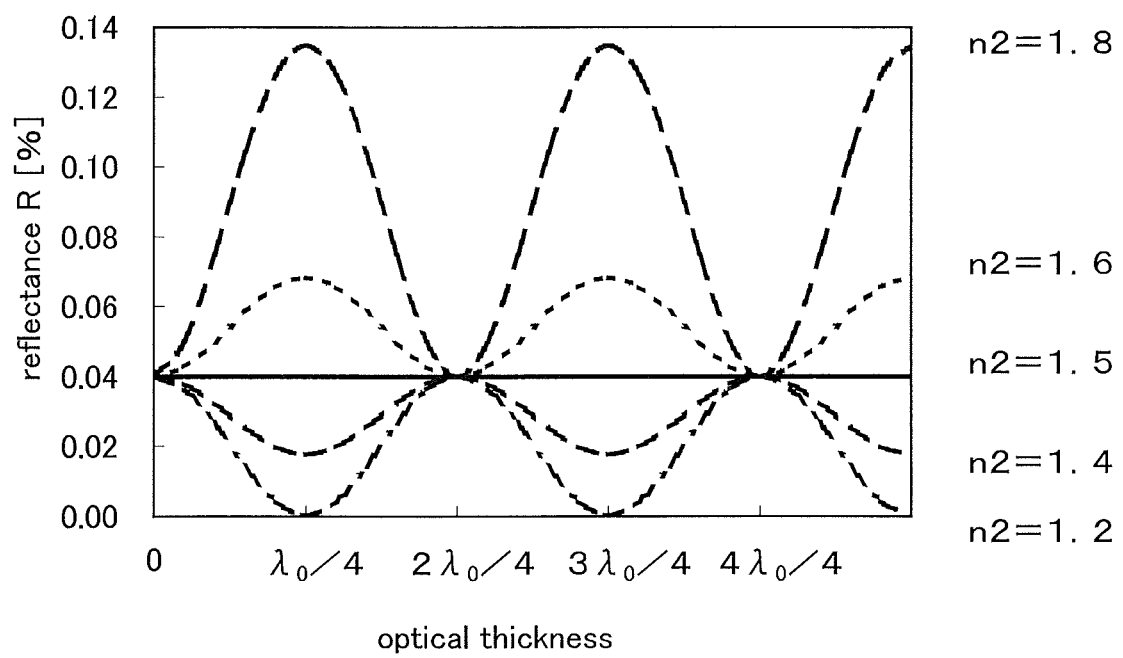
FIG. 5 shows an example of changes in reflectance with respect to optical thickness.

In Mathematical Formula 1, FIG. 5 shows changes of reflectance with respect to the optical thickness of the layer having a refractive index n2 in the case where five types of refractive indexes n2 are used on the assumption that n1 is 1 and n3 is 1.5. It is confirmed from FIG. 5 that the reflectance R has a maximum value every an odd multiple of $\lambda_0/4$ by alternately stacking a film having a low refractive index and a film having a high refractive index as in the case where n1 is lower than n2 and n2 is higher than n3. On the other hand, it is confirmed that the reflectance R has a maximum value every even multiple of $\lambda_0/4$ in such a way that films are stacked so that their refractive indexes are arranged in a stepwise manner as in the case where n1 is lower than n2 and n2 is lower than n3. Although not shown, an effect which is similar to that of the case where n1 is lower than n2 and n2 is higher than n3 can be obtained in the case where n1 is higher than n2 and n2 is lower than n3; and an effect which is similar to that of the case where n1 is lower than n2 and n2 is lower than n3 can be obtained in the case where n1 is higher than n2 and n2 is higher than n3.

By utilizing a change of a reflectance with respect to the above thickness, it is possible to increase the reflectance in a given wavelength. By the increase in the reflectance in the wavelength region of the light absorbed by the oxide semiconductor, the amount of light absorbed by the channel portion formed using the oxide semiconductor layer can be reduced. Accordingly, the light deterioration can be reduced.

Calculation may be performed on the assumption that not only a film formed over a substrate but also air and a liquid crystal in the case of a liquid crystal display device using a liquid crystal element as a display element are assumed as a layer having a refractive index of n1 or n3.

The thickness of a layer in the case of normal incidence as described above, that is, the layer through which light passes and which is provided in an optical path of light with which the channel portion formed using the oxide semiconductor layer is irradiated along a normal direction of a film plane of the oxide semiconductor layer may be calculated from a relation between a refractive index of the layer and a refractive index of another layer in contact with the layer. Further, because light irradiation can be performed from the top surface and rear surface of the oxide semiconductor layer, the optical path of each light is calculated. A layer which is provided in the optical path of light and through which light passes is located at the middle of the three consecutive layers, and a relation between refractive indexes of the three consecutive layers may be considered.

In other words, in the present invention, in the case where light of wavelength $\lambda_0$ passes through one layer whose refractive index n is higher or lower, that is, in the case where the light in the wavelength $\lambda_0$ passes through a layered structure having a relation in which a layer located at the middle of three consecutive layers has the highest refractive index or the lowest refractive index, the optical thickness L of the layer (the above-described layer located at the middle of the layers) is set to $\lambda_0 k/4$ (k is an odd number greater than or equal to 1). When the optical thickness L is converted to physical thickness d where the refractive index of a film which forms the layer is n and the wavelength of light is $\lambda_0$, the optical thickness L is converted to $\lambda_0 k/4n$.

In the present invention, in the case where the light in the wavelength $\lambda_0$ passes through the layer located at the middle of the layers and the refractive indexes of the layers are arranged in a stepwise manner, that is, in the case where the light in the wavelength $\lambda_0$ passes through a layered structure in which the layer located at the middle of three consecutive layers is in contact with a layer having the highest refractive index of the three consecutive layers and with a layer having the lowest refractive index of the three consecutive layers, the optical thickness L of the layer (the above-described layer located at the middle of the layers) is set to $\lambda_0 m/4$ (m is an even number greater than or equal to 2). When the optical thickness L is converted to the physical thickness d where the refractive index of a film which forms the layer is n and the wavelength of light is $\lambda_0$, the optical thickness L is converted to $\lambda_0 m/4n$.

In addition, it is preferable that the optical thickness of the channel portion formed using the oxide semiconductor layer be optically an odd multiple of $\lambda_0/4$ or an even multiple of $\lambda_0/4$ in accordance with the above conditions; however, due to the requirements of electrical characteristics or the like of a transistor, an odd multiple of $\lambda_0/4$ or an even multiple of $\lambda_0/4$ is not recommended in terms of electrical characteristics in some cases. In that case, the electrical characteristics may be prioritized. In this case, an effect can be obtained by adjustment of the thickness of another film although an effect of the invention is reduced to some extent. In other words, the thickness of a film formed using an insulator or a conductor other than an oxide semiconductor may be adjusted.

With this structure, reflection which occurs when light is incident on the layer (the above-described layer located at the middle of the layers) and reflection which occurs when light passes through the layer are amplified with each other; as a result, reflection which occurs due to the existence of the layer increases. As the reflection increases, the amount of light in the wavelength $\lambda_0$ which reaches the channel portion formed using the oxide semiconductor layer is reduced, and the amount of light which is absorbed by the channel portion formed using the oxide semiconductor layer is reduced, whereby an effect of reducing light deterioration is obtained.

Note that a thickness having an odd multiple of $\lambda_0/4$ or an even multiple of $\lambda_0/4$ is used to obtain a maximum effect as in FIG. 5; it is found from FIG. 5 that a given effect is obtained as long as the thickness is within a given thickness range. If greater than or equal to 90% of the maximum effect is a highly effective range, the optical thickness L of the layer having such a reflectance is within the range of from −24% of $\lambda_0/4$ to +24% of $\lambda_0/4$ around an odd multiple of $\lambda_0/4$ or an even multiple of $\lambda_0/4$. From the above description, in the present invention and this specification, the phrase "roughly an odd multiple of $\lambda_0/4$" means that an odd multiple of $\lambda_0/4$ has a range of ±24% of $\lambda_0/4$ as expressed by Mathematical Formula 2; similarly, the phrase "roughly an even multiple of $\lambda_0/4$" means that an even multiple of $\lambda_0/4$ has a range of ±24% of $\lambda_0/4$ as expressed by Mathematical Formula 3.

$$L = \frac{\lambda_0 k}{4} \pm \frac{\lambda_0}{4} \times 0.24 \qquad \text{[Mathematical Formula 2]}$$

(k is an odd number greater than or equal to 1)

$$L = \frac{\lambda_0 m}{4} \pm \frac{\lambda_0}{4} \times 0.24 \qquad \text{[Mathematical Formula 3]}$$

(m is an even number greater than or equal to 2)

Of a plurality of layers which is needed for forming the transistor, the finished thickness of each layer which is provided in an optical path of light with which the channel portion formed using the oxide semiconductor layer can be irradiated along a normal direction may be set from the relation between the refractive index of the layer and the refractive indexes of the upper layer and the lower layer according to this embodiment. With the structure, a function with respect to the transistor is not lost, and the reflectance in the wavelength region of the light absorbed by the channel portion formed using the oxide semiconductor layer can be increased, and the amount of light absorbed by the channel portion formed using the oxide semiconductor layer can be reduced, whereby an effect of reducing light deterioration is obtained.

Embodiment 1

In this embodiment, an example of a semiconductor device according to one embodiment of the present invention will be described with reference to FIGS. 6A to 6C, FIGS. 7A to 7C, FIGS. 8A to 8C, and FIGS. 9A to 9C.

Figure 6A:
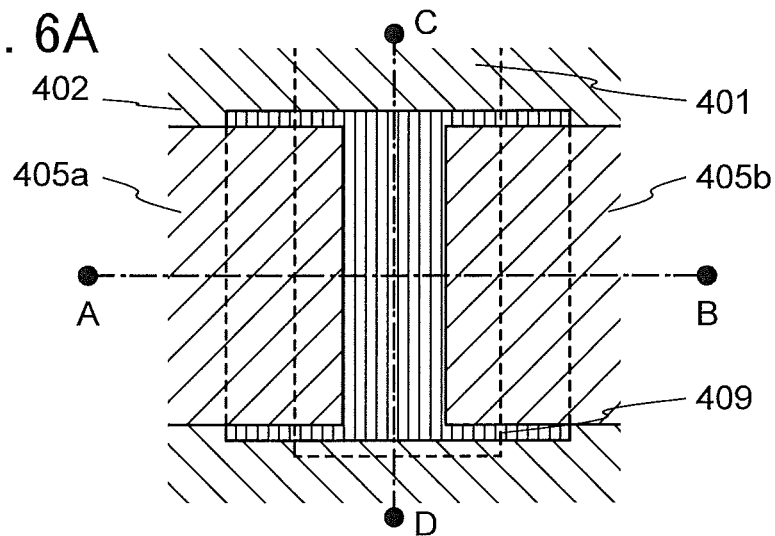
FIG. 6A is a plan view and FIGS. 6B and 6C are cross-sectional views illustrating one embodiment of a semiconductor device.
Figure 6B:
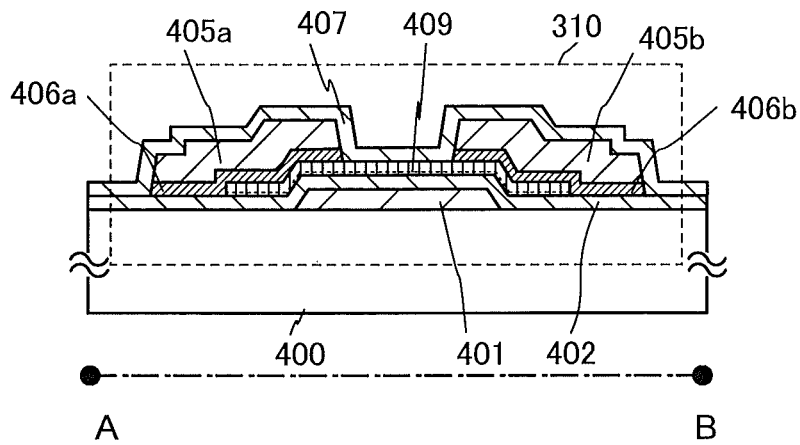
Figure 6C:
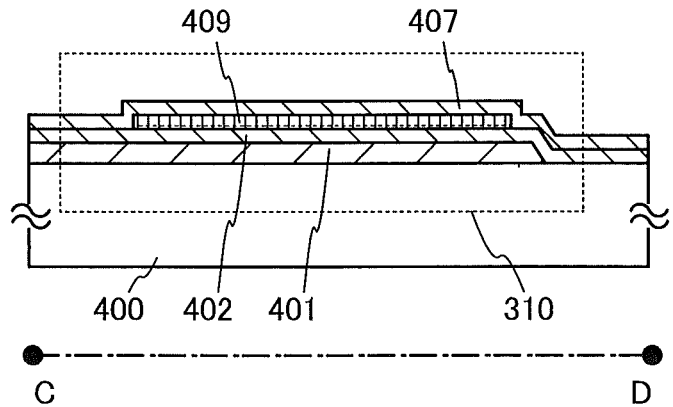

FIGS. 6A to 6C are a plan view and cross-sectional views of a transistor 310 as an example of a semiconductor device according to one embodiment of the disclosed invention. In FIGS. 6A to 6C, a bottom-gate transistor is illustrated as a transistor according to one embodiment of the disclosed invention. Here, FIG. 6A is a plan view and FIGS. 6B and 6C are cross-sectional views taken along line A-B and line C-D, respectively, of FIG. 6A. Note that part of components of the transistor 310 (e.g., a protective insulating film 407 and the like) is omitted in FIG. 6A for brevity.

The transistor 310 in FIGS. 6A to 6C includes, over a substrate 400 having an insulating surface, a gate electrode 401, a gate insulating layer 402, an oxide semiconductor layer 409, a source electrode formed of a first conductive layer 406a and a second conductive layer 405a, a drain electrode formed of a first conductive layer 406b and a second conductive layer 405b, and the protective insulating film 407.

In the transistor 310 illustrated in FIGS. 6A to 6C, the protective insulating film 407 is provided so as to cover the source electrode formed of the first conductive layer 406a and the second conductive layer 405a, and the drain electrode formed of the first conductive layer 406b and the second conductive layer 405b and to be in contact with the gate insulating layer 402 and the oxide semiconductor layer 409. Further, in the transistor 310 illustrated in FIGS. 6A to 6C, the protective insulating film 407 and the gate insulating layer 402 are in contact with each other in a region where the oxide semiconductor layer 409 is not provided. That is, the oxide semiconductor layer 409 is surrounded by the gate insulating layer 402 and the protective insulating film 407.

Here, the oxide semiconductor layer 409 is preferably a highly-purified oxide semiconductor film in which oxygen vacancy are reduced, formed by sufficiently removing an impurity such as hydrogen or water and sufficiently supplying oxygen. Specifically, for example, the hydrogen concentration in the oxide semiconductor layer 409 is lower than or equal to $5\times10^{19}$ atoms/cm$^3$, preferably lower than or equal to $5\times10^{18}$ atoms/cm$^3$, further preferably lower than or equal to $5\times10^{17}$ atoms/cm$^3$. Note that the hydrogen concentration in the oxide semiconductor layer 409 is measured by secondary ion mass spectroscopy (SIMS). In the oxide semiconductor layer 409 which is highly purified by sufficiently reducing the hydrogen concentration and in which defect levels in the energy gap due to oxygen deficiency are decreased by supplying a sufficient amount of oxygen, the carrier concentration is lower than $1\times10^{12}$/cm$^3$, preferably lower than $1\times10^{11}$/cm$^3$, further preferably lower than $1.45\times10^{10}$/cm$^3$. With an i-type (intrinsic) oxide semiconductor or substantially i-type oxide semiconductor formed as described above, a transistor having excellent electrical characteristics can be obtained. Hereinafter, in this specification, an oxide semiconductor layer which is highly purified by sufficiently reducing the hydrogen concentration and in which defect levels in the energy gap due to oxygen deficiency are decreased by supplying a sufficient amount of oxygen is simply referred to as a highly-purified oxide semiconductor layer, in some cases.

In addition, it is preferable that the density of alkali metal or alkaline earth metal be lower than or equal to $2\times10^{16}$ atoms/cm$^3$, preferably lower than or equal to $1\times10^{15}$ atoms/cm$^3$. By reducing alkali metal or alkaline earth metal from the oxide semiconductor, a transistor having good electrical characteristics can be obtained.

In addition, it is preferable that the oxide semiconductor layer 409 have high c-axis orientation. The oxide semiconductor layer 409 may be a single crystal, or may have high c-axis orientation even in a polycrystalline state. A crystalline region may be included in an amorphous state, and the crystalline region may have c-axis orientation. If the oxide semiconductor layer 409 has such high c-axis orientation, light deterioration is less likely to occur.

As for the gate insulating layer 402 and the protective insulating film 407 each of which is in contact with the oxide semiconductor layer 409, an insulating film containing oxygen is preferable, and a film including a region where the proportion of oxygen is higher than that in the stoichiometric composition (such a region is also referred to as an oxygen-excess region) is further preferable. When the gate insulating layer 402 and the protective insulating film 407 each of which is in contact with the oxide semiconductor layer 409 include an oxygen-excess region, oxygen can be prevented from transferring from the oxide semiconductor layer 409 to the gate insulating layer 402 or the protective insulating film 407. Further, oxygen can be supplied to the oxide semiconductor layer 409 from the gate insulating layer 402 or the protective insulating film 407. Thus, the oxide semiconductor layer 409 sandwiched between the gate insulating layer 402 and the protective insulating film 407 can be a film containing a sufficient amount of oxygen.

The gate insulating layer 402 and the protective insulating film 407 can be formed using any of silicon oxide, silicon nitride, silicon oxynitride, silicon nitride oxide, aluminum oxide, aluminum nitride, aluminum oxynitride, aluminum nitride oxide, hafnium oxide, gallium oxide, and aluminum gallium oxide, or a mixed material thereof. The structure of each of the gate insulating layer 402 and the protective insulating film 407 is not limited to a single-layer structure, and may be a layered structure of a plurality of the above materials.

It is preferable that an insulating material containing the same kind of component as the oxide semiconductor layer be used for the gate insulating layer 402 and the protective insulating film 407. Such a material enables the state of the interface with the oxide semiconductor layer to be kept well. Here, containing "the same kind of component as the oxide semiconductor layer" means containing one or more elements selected from constituent elements of the oxide semiconductor layer. For example, in the case where the oxide semiconductor layer is formed using an In—Ga—Zn-based oxide semiconductor material, gallium oxide, aluminum gallium oxide, and the like are given as such an insulating material containing the same kind of component as the oxide semiconductor layer.

In this embodiment, the physical thickness d of the gate insulating layer 402 is $\lambda_0 k_1/4n_a$ ($k_1$ is an odd number greater than or equal to 1) where the wavelength of light is $\lambda_0$ and the refractive index of the gate insulating layer 402 in the wavelength $\lambda_0$ is $n_a$.

In this embodiment, the physical thickness d of the channel portion of the oxide semiconductor layer 409 is $\lambda_0 k_2/4n_b$ ($k_2$ is an odd number greater than or equal to 1) where the wavelength of light is $\lambda_0$ and the refractive index of the channel portion of the oxide semiconductor layer 409 in the wavelength $\lambda_0$ is $n_b$.

In this embodiment, the physical thickness d of the protective insulating film 407 is $\lambda_0 m/4n_c$ (in is an even number greater than or equal to 2) where the wavelength of light is $\lambda_0$ and the refractive index of the protective insulating film 407 in the wavelength $\lambda_0$ is $n_c$.

In the semiconductor device having such a structure in this embodiment, until light delivered from an air layer (a refractive index of approximately 1) on the upper side of the substrate is absorbed by the channel portion of the oxide semiconductor layer 409, the light passes through the protective insulating film 407, the oxide semiconductor layer 409, and the gate insulating layer 402, and reflection is repeated multiple times at each interface. Thus, with the structure having the above-described thickness, the reflectance of light in the wavelength $\lambda_0$ can be increased; as a result, the amount of light absorbed by the channel portion of the oxide semiconductor layer 409 can be reduced. By reduction in the amount of light to be absorbed, an effect of reducing light deterioration is obtained.

Figure 10:
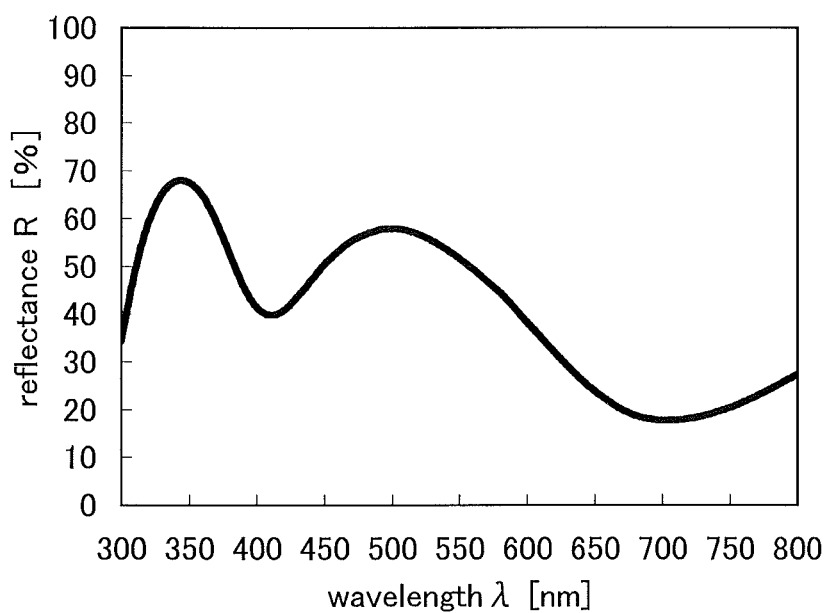
FIG. 10 shows a calculation example of reflectance with respect to light from 300 nm to 800 nm.

FIG. 10 shows the result of changes of the reflectance in the wavelength from 300 nm to 800 nm in the case of a structure of this embodiment, which are obtained by calculation using a Fresnel coefficient method. The reflectance described here refers to the ratio of light which is not absorbed by the above-described multi-layer film and which returns as reflected light among light delivered from the air layer on the upper side of the substrate. As a specific structure, it is assumed that the gate electrode 401 is formed using tungsten over the substrate 400, the gate insulating layer 402 is formed using a silicon oxide film containing nitrogen, and the protective insulating film 407 is formed using silicon oxide film. It is assumed that the oxide semiconductor layer 409 is formed using an In—Ga—Zn-based oxide semiconductor material. Each thickness is set in such a way that, where $\lambda_0$ is 330 nm as a center wavelength in the wavelength region of the light that is desired to be reflected, the physical thickness d of the gate insulating layer 402 is 55 nm (an optical thickness of $\lambda_0/4$), the physical thickness d of the channel portion of the oxide semiconductor layer 409 is 35 nm (an optical thickness of $\lambda_0/4$), and the physical thickness d of the protective insulating film 407 is 218 nm (an optical thickness of $4\lambda_0/4$).

It is found from FIG. 10 that high reflectance is obtained with a peak of the wavelength of around 330 nm.

Figure 11:
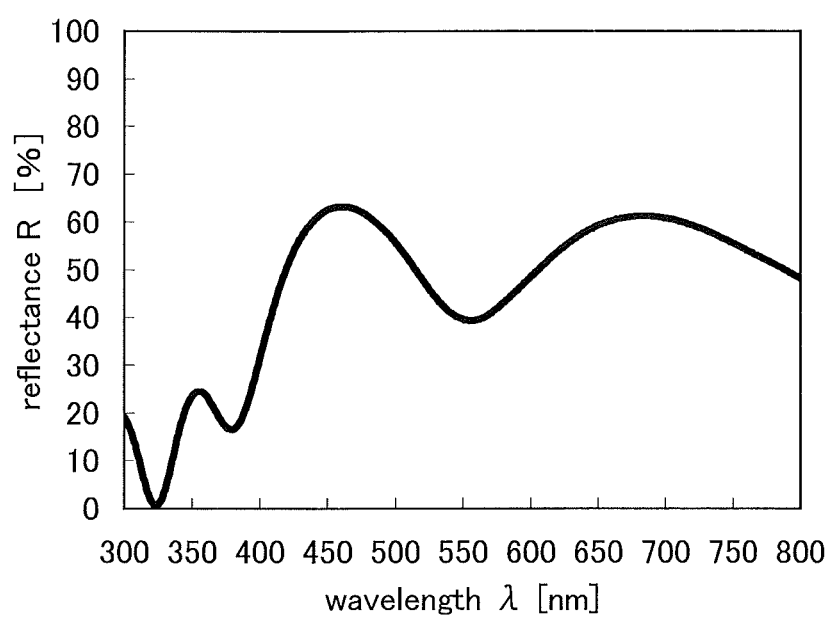
FIG. 11 shows a comparative example.

FIG. 11 shows calculation results in the case where each thickness is set without depending on this embodiment in the structure having similar kinds of films as a comparative example. Specifically, the thickness of the gate insulating layer 402 is set to 100 nm, the thickness of the channel portion of the oxide semiconductor layer 409 is set to 40 nm, and the thickness of the protective insulating film 407 is set to 300 nm. It is found from the results of FIG. 11 that the reflectance in the wavelength from 300 nm to 400 nm is low and that light in the wavelength region is absorbed by the oxide semiconductor.

In this manner, with the structure having the thickness according to this embodiment, the reflectance in a given wavelength can be increased, and the amount of light absorbed by the oxide semiconductor can be reduced. As a result, an effect of reducing light deterioration is obtained.

The thickness of each film and layers is set in such a way that the thickness in a stage of a completed semiconductor device has such a thickness. In the case where a semiconductor device is actually formed, the thickness of a film provided below the source electrode formed of the first conductive layer 406a and the second conductive layer 405a, the drain electrode formed of the first conductive layer 406b and the second conductive layer 405b, and the like might be reduced by etching for forming the source electrode, the drain electrode, and the like, in some cases. In that case, in consideration of the film reduction, a portion corresponding to an optical path when light is incident on the channel portion of the oxide semiconductor layer 409 is necessary to be adjusted so as to have a prescribed thickness, which can be done by a practitioner as appropriate. In addition, the above calculation of light delivered from the upper side of the substrate is performed; however, calculation of light delivered from the lower side of the substrate may be similarly performed and the thickness may be adjusted. In other words, the thickness of each film and layers at least in the portion corresponding to an optical path when light is incident on the channel portion of the oxide semiconductor layer 409 is the above thickness according to one embodiment of the present invention.

Figure 7A:
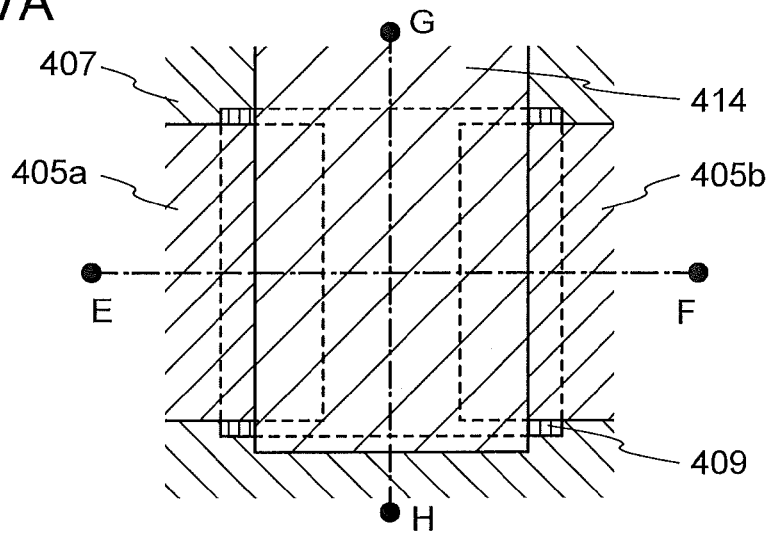
FIG. 7A is a plan view and FIGS. 7B and 7C are cross-sectional views illustrating one embodiment of a semiconductor device.
Figure 7B:
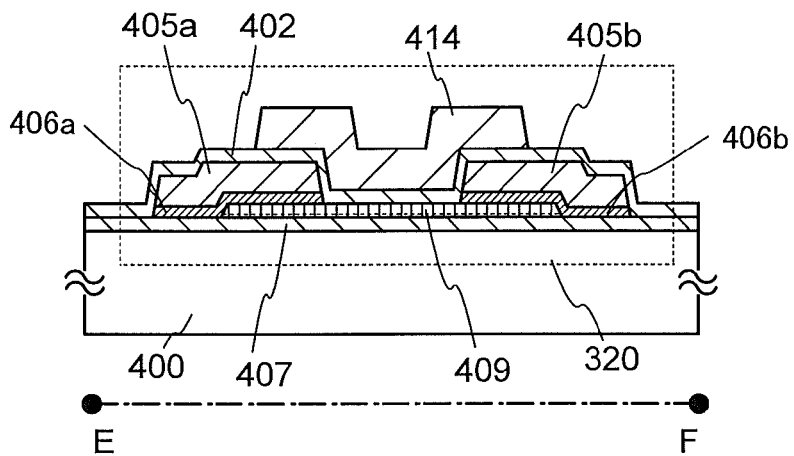
Figure 7C:
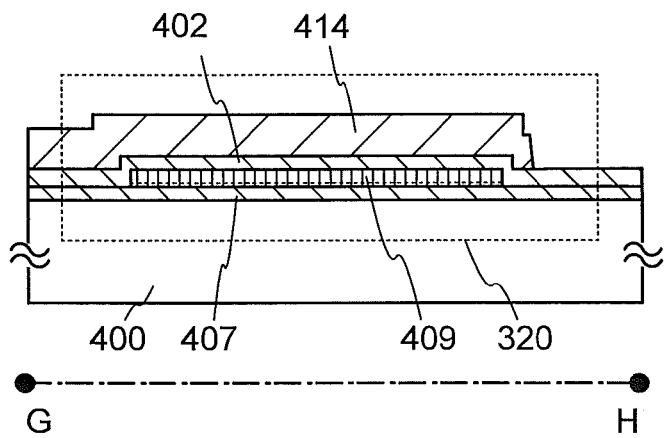

FIGS. 7A to 7C are a plan view and cross-sectional views of a transistor 320 which has a different structure from the transistor 310. In FIGS. 7A to 7C, a top-gate transistor is illustrated as a transistor according to one embodiment of the disclosed invention. Here, FIG. 7A is a plan view and FIGS. 7B and 7C are cross-sectional views taken along line E-F and line G-H, respectively, of FIG. 7A. Note that part of components of the transistor 320 (e.g., the gate insulating layer 402 and the like) is omitted in FIG. 7A for brevity.

The transistor 320 illustrated in FIGS. 7A to 7C includes, over the substrate 400 having an insulating surface, the protective insulating film 407, the oxide semiconductor layer 409, the source electrode formed of the first conductive layer 406a and the second conductive layer 405a, the drain electrode formed of the first conductive layer 406b and the second conductive layer 405b, the gate insulating layer 402, and a gate electrode 414.

In the transistor 320 illustrated in FIGS. 7A to 7C, the gate insulating layer 402 is provided so as to cover the source electrode formed of the first conductive layer 406a and the second conductive layer 405a, the drain electrode formed of the first conductive layer 406b and the second conductive layer 405b and to be in contact with part of the protective insulating film 407 and the oxide semiconductor layer 409. In the transistor 320 illustrated in FIGS. 7A to 7C, the gate insulating layer 402 and the protective insulating film 407 are in contact with each other in a region where the oxide semiconductor layer 409 is not provided, as in the transistor 310 illustrated in FIGS. 6A to 6C. In other words, the oxide semiconductor layer 409 is surrounded by the gate insulating layer 402 and the protective insulating film 407. The other components are the same as those of the transistor 310 in FIGS. 6A to 6C; thus, the description of FIGS. 6A to 6C can be referred to for the details.

Figure 8A:
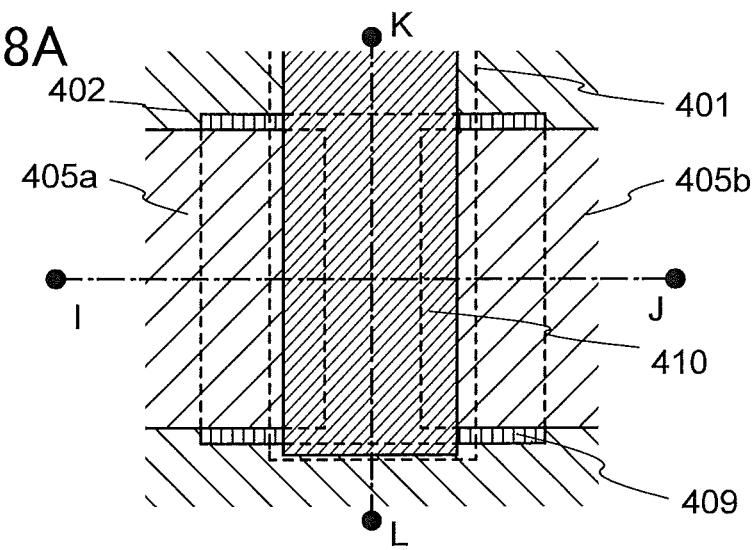
FIG. 8A is a plan view and FIGS. 8B and 8C are cross-sectional views illustrating one embodiment of a semiconductor device.
Figure 8B:
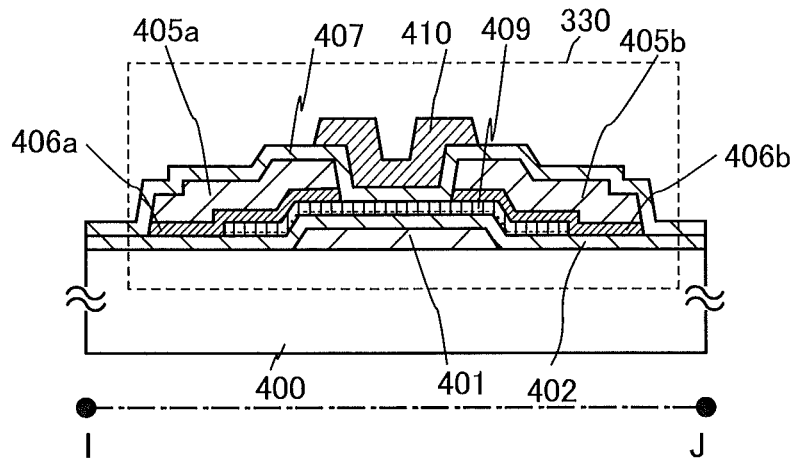
Figure 8C:
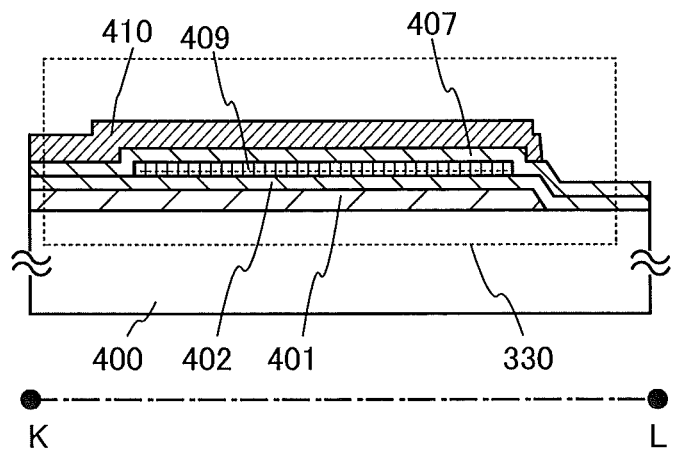

FIGS. 8A to 8C are a plan view and cross-sectional views of a transistor 330 which has a different structure from the transistor 310 and the transistor 320. Here, FIG. 8A is a plan view, and FIGS. 8B and 8C are cross-sectional views taken along line I-J and line K-L, respectively, of FIG. 8A. Note that part of components of the transistor 330 (e.g., the protective insulating film 407 and the like) is omitted in FIG. 8A for brevity.

The transistor 330 illustrated in FIGS. 8A to 8C includes, over the substrate 400 having an insulating surface, the gate electrode 401, the gate insulating layer 402, the oxide semiconductor layer 409, the source electrode formed of the first conductive layer 406a and the second conductive layer 405a, the drain electrode formed of the first conductive layer 406b and the second conductive layer 405b, the protective insulating film 407, and a conductive layer 410 provided in a region overlapping with the oxide semiconductor layer 409.

In the transistor 330 illustrated in FIGS. 8A to 8C, the protective insulating film 407 is provided so as to cover the source electrode formed of the first conductive layer 406a and the second conductive layer 405a and the drain electrode formed of the first conductive layer 406b and the second conductive layer 405b and to be in contact with the gate insulating layer 402 and the oxide semiconductor layer 409. In the transistor 330 illustrated in FIGS. 8A to 8C, the gate insulating layer 402 and the protective insulating film 407 are in contact with each other in a region where the oxide semiconductor layer 409 is not provided, as in the transistor 310 illustrated in FIGS. 6A to 6C. In other words, the oxide semiconductor layer 409 is surrounded by the gate insulating layer 402 and the protective insulating film 407.

In the transistor 330, the conductive layer 410 can function as a second gate electrode. In that case, the protective insulating film 407 functions as a gate insulating film. The other components are the same as those of the transistor 310 in FIGS. 6A to 6C; thus, the description of FIGS. 6A to 6C can be referred to for the details.

Figure 9A:
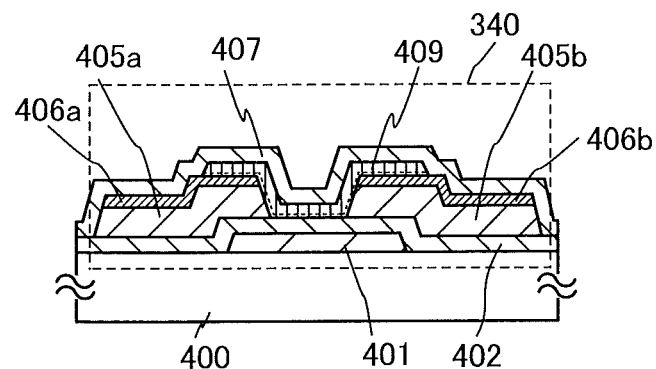
FIGS. 9A to 9C are cross-sectional views each illustrating one embodiment of a semiconductor device.
Figure 9B:
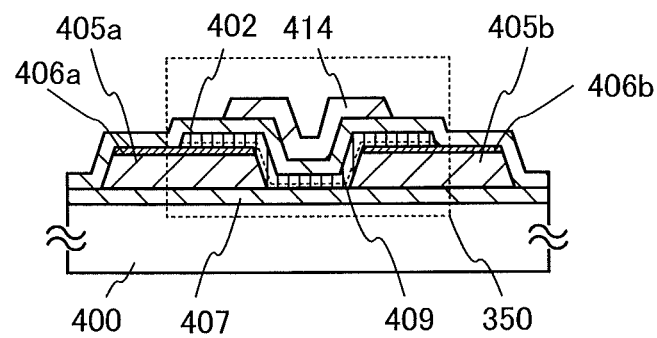
Figure 9C:
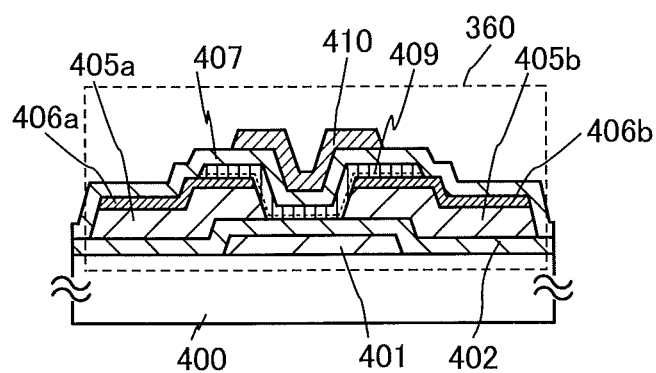

FIGS. 9A to 9C are cross-sectional views of transistors which have different structures from the above transistors. Note that the structures of FIGS. 9A to 9C can be combined with any of the structures of FIGS. 6A to 6C, FIGS. 7A to 7C, and FIGS. 8A to 8C, as appropriate.

Like the transistor 310, a transistor 340 illustrated in FIG. 9A includes, over the substrate 400 having an insulating surface, the gate electrode 401, the gate insulating layer 402, the oxide semiconductor layer 409, the source electrode formed of the first conductive layer 406a and the second conductive layer 405a, the drain electrode formed of the first conductive layer 406b and the second conductive layer 405b, and the protective insulating film 407. A difference between the transistor 340 and the transistor 310 is a position where the oxide semiconductor layer 409 is connected to the source electrode formed of the first conductive layer 406a and the second conductive layer 405a and the drain electrode formed of the first conductive layer 406b and the second conductive layer 405b. In other words, in the transistor 340, a bottom of the oxide semiconductor layer 409 is in contact with the source electrode formed of the first conductive layer 406a and the second conductive layer 405a and the drain electrode formed of the first conductive layer 406b and the second conductive layer 405b. The other components are the same as those of the transistor 310 in FIGS. 6A to 6C; thus, the description of FIGS. 6A to 6C can be referred to for the details.

Like the transistor 320, a transistor 350 illustrated in FIG. 9B includes, over the substrate 400 having an insulating surface, the protective insulating film 407, the oxide semiconductor layer 409, the source electrode formed of the first conductive layer 406a and the second conductive layer 405a, the drain electrode formed of the first conductive layer 406b and the second conductive layer 405b, the gate insulating layer 402, and the gate electrode 414. A difference between the transistor 350 and the transistor 320 is a position where the oxide semiconductor layer 409 is connected to the source electrode formed of the first conductive layer 406a and the second conductive layer 405a and the drain electrode formed of the first conductive layer 406b and the second conductive layer 405b. In other words, in the transistor 350, a bottom of the oxide semiconductor layer 409 is in contact with the source electrode formed of the first conductive layer 406a and the second conductive layer 405a and the drain electrode formed of the first conductive layer 406b and the second conductive layer 405b. The other components are the same as those of the transistor 320 in FIGS. 7A to 7C; thus, the description of FIGS. 7A to 7C and FIGS. 6A to 6C can be referred to for the details.

Like the transistor 330, a transistor 360 illustrated in FIG. 9C includes, over the substrate 400 having an insulating surface, the gate electrode 401, the gate insulating layer 402, the oxide semiconductor layer 409, the source electrode formed of the first conductive layer 406a and the second conductive layer 405a, the drain electrode formed of the first conductive layer 406b and the second conductive layer 405b, the protective insulating film 407, and the conductive layer 410 provided in a region overlapping with the oxide semiconductor layer 409. A difference between the transistor 360 and the transistor 330 is a position where the oxide semiconductor layer 409 is connected to the source electrode formed of the first conductive layer 406a and the second conductive layer 405a and the drain electrode formed of the first conductive layer 406b and the second conductive layer 405b. In other words, in the transistor 360, a bottom of the oxide semiconductor layer 409 is in contact with the source electrode formed of the first conductive layer 406a and the second conductive layer 405a and the drain electrode formed of the first conductive layer 406b and the second conductive layer 405b. The other components are the same as those of the transistor 330 in FIGS. 8A to 8C; thus, the description of FIGS. 8A to 8C and FIGS. 6A to 6C can be referred to for the details.

Embodiment 2

Hereinafter, an example of a manufacturing process of a transistor according to this embodiment will be described with reference to FIGS. 12A to 12E.

An example of a manufacturing process of the transistor 310 in FIGS. 6A to 6C will be described with reference to FIGS. 12A to 12E. Note that a material and a method (including an interchange of the order of steps) which are similar to those of the transistor 310 can be used for the cases of other transistors.

As for the thickness of each layer, the thickness of each layer in the portion corresponding to the light path when light enters the channel portion of the oxide semiconductor layer 409 is adjusted to a prescribed thickness described in one embodiment of the present invention. In consideration of the refractive index of each layer, the thickness in deposition is adjusted as appropriate so that the finished thickness is the prescribed thickness.

First, a conductive film is formed over the substrate 400 having an insulating surface. Then, a resist mask is formed over the conductive film through a first photolithography step, and selective etching is performed, whereby the gate electrode 401 is formed. Then, the resist mask is removed. Note that a resist mask may be formed by an inkjet method. Formation of the resist mask by an inkjet method needs no photomask; thus, manufacturing cost can be reduced.

Although there is no particular limitation on a substrate which can be used as the substrate 400 having an insulating surface, it is necessary that the substrate have at least heat resistance high enough to withstand heat treatment to be performed later. For example, a substrate such as a glass substrate, a ceramic substrate, a quartz substrate, or a sapphire substrate can be used. As long as the substrate 400 has an insulating surface, a single crystal semiconductor substrate or a polycrystalline semiconductor substrate of silicon, silicon carbide, or the like; a compound semiconductor substrate of silicon germianium or the like; an SOI substrate; or the like can be used, and a semiconductor element may be provided over the substrate.

A flexible substrate may be used as the substrate 400. In the case where a flexible substrate is used, the following methods can be given, and either of them may be used: a method in which a transistor including an oxide semiconductor layer is directly formed over a flexible substrate; and a method in which a transistor including an oxide semiconductor layer is formed over another substrate and is transferred to a flexible substrate. In the case where the method in which the transistor is transferred to a flexible substrate is employed, the substrate over which the transistor is formed may be provided with a separation layer.

An insulating film serving as a base film may be provided between the substrate 400 and the gate electrode 401. The base film has a function of preventing diffusion of an impurity element from the substrate 400, and can be formed using a silicon nitride film, a silicon oxide film, a silicon nitride oxide film, a silicon oxynitride film, and a gallium aluminum oxide ($Ga_xAl_{2-x}O_{3+y}$ (x is greater than or equal to 0 and less than or equal to 2, and y is greater than 0)) film. The structure of the base film is not limited to a single-layer structure, and may be a layered structure of a plurality of the above films.

In addition, the gate electrode 401 can be formed to have a single-layer structure or a layered structure using any of metal materials such as molybdenum, titanium, tantalum, tungsten, aluminum, copper, neodymium, and scandium, or an alloy material which contains any of these materials as a main component. Alternatively, the gate electrode 401 may be formed using a light-transmitting conductive metal oxide. As the conductive metal oxide, indium oxide ($In_2O_3$), tin oxide ($SnO_2$), zinc oxide (ZnO), an alloy of indium oxide and tin oxide ($In_2O_3$—$SnO_2$, referred to as ITO), an alloy of indium oxide and zinc oxide ($In_2O_3$—ZnO), and such a metal oxide material containing silicon oxide can be used.

Figure 12A:
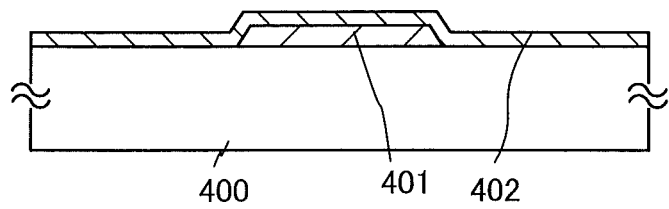
FIGS. 12A to 12E illustrate an example of a manufacturing process of a semiconductor device.

Next, the gate insulating layer 402 is formed over the gate electrode 401 (see FIG. 12A). The gate insulating layer 402 can be formed using any of silicon oxide, silicon nitride, silicon oxynitride, silicon nitride oxide, aluminum oxide, aluminum nitride, aluminum oxynitride, aluminum nitride oxide, hafnium oxide, gallium oxide, and aluminum gallium oxide, or a mixed material thereof by a plasma-enhanced CVD method, a sputtering method, or the like. The structure of the gate insulating layer 402 is not limited to a single-layer structure, and may be a layered structure of a plurality of the above materials.

It is preferable that an insulating material containing the same kind of component as the oxide semiconductor layer be used for the gate insulating layer 402. Such a material enables the state of the interface with the oxide semiconductor layer to be kept well. Here, containing "the same kind of component as the oxide semiconductor layer" means containing one or more elements selected from constituent elements of the oxide semiconductor layer. For example, in the case where the oxide semiconductor layer is formed using an In—Ga—Zn-based oxide semiconductor material, gallium oxide, aluminum gallium oxide, and the like are given as such an insulating material containing the same kind of component as the oxide semiconductor layer.

The gate insulating layer 402 is preferably formed using a method with which an impurity such as water or hydrogen does not enter the gate insulating layer 402. If an impurity such as hydrogen or water is contained in the gate insulating layer 402, an impurity such as hydrogen or water may enter the oxide semiconductor layer to be formed later or may cause extraction of oxygen in the oxide semiconductor layer. As a result, resistance of the oxide semiconductor layer is reduced (the oxide semiconductor layer is to be an n-type oxide semiconductor layer), so that the off-state current might increase and threshold voltage might shift. Therefore, the gate insulating layer 402 is preferably formed so as to include an impurity such as hydrogen or water as few as possible. For example, the gate insulating layer 402 is preferably formed by a sputtering method. A high-purity gas from which an impurity such as hydrogen or water is removed is preferable for a sputtering gas used in film formation.

As a sputtering method, a DC sputtering method using a direct-current power supply, a pulsed DC sputtering method in which a DC bias is applied in a pulsed manner, an AC sputtering method using an AC power source, or the like can be used.

Note that in the case where an aluminum gallium oxide film is formed as the gate insulating layer 402, a gallium oxide target to which an aluminum particle is added may be applied as a target used in a sputtering method. Using a gallium oxide target to which an aluminum particle is added can make conductivity of the target increase; thus, discharge during sputtering can be facilitated. With such a target, a gate insulating layer suitable for mass production can be manufactured.

Next, treatment for supplying oxygen is preferably performed on the gate insulating layer 402. As the treatment for supplying oxygen, heat treatment in an oxygen atmosphere, oxygen doping treatment, and the like can be given. Alternatively, oxygen may be added by performing irradiation with oxygen ions accelerated by an electric field. Note that in this specification or the like, "oxygen doping treatment" means addition of oxygen to a bulk, and the term "bulk" is used in order to clarify that oxygen is added not only to a surface of a thin film but also to the inside of the thin film. In addition, "oxygen doping" includes "oxygen plasma doping" in which oxygen that is made to be plasma is added to a bulk.

Treatment for supplying oxygen such as oxygen doping treatment is performed on the gate insulating layer 402, whereby a region where the proportion of oxygen is higher than that in the stoichiometric composition is formed in the gate insulating layer 402. Providing such a region allows oxygen to be supplied to the oxide semiconductor layer which is formed later, and accordingly, oxygen vacancy in the oxide semiconductor layer or the interface between the oxide semiconductor layer and the gate insulating layer 402 can be suppressed.

Alternatively, an oxygen gas or a mixed gas containing an inert gas (e.g., nitrogen or a rare gas such as argon) and oxygen is introduced during the deposition of the gate insulating layer 402 by a sputtering method, whereby an oxygen-excess region can be formed in the gate insulating layer 402.

For example, in the case where an aluminum gallium oxide film is used as the gate insulating layer 402, treatment for supplying oxygen such as oxygen doping treatment is performed; thus, the composition of aluminum gallium oxide can be $Ga_xAl_{2-x}O_{3+\alpha}$ ($0<x<2$, $0<\alpha<1$).

Next, a first oxide semiconductor layer is formed, and then subjected to first heat treatment so that a region including at least a surface of the first oxide semiconductor layer is crystallized, thereby forming a first oxide semiconductor layer 403. Note that the gate insulating layer 402 and the first oxide semiconductor layer are preferably formed successively without exposure to air.

Examples of oxide semiconductors used for the first oxide semiconductor layer include an In—Sn—Ga—Zn—O-based oxide semiconductor which is an oxide of four metal elements; an In—Ga—Zn—O-based oxide semiconductor, an In—Sn—Zn—O-based oxide semiconductor, an In—Al—Zn—O-based oxide semiconductor, a Sn—Ga—Zn—O-based oxide semiconductor, an Al—Ga—Zn—O-based oxide semiconductor, and a Sn—Al—Zn—O-based oxide semiconductor which are oxides of three metal elements; an In—Zn—O-based oxide semiconductor, a Sn—Zn—O-based oxide semiconductor, an Al—Zn—O-based oxide semiconductor, a Zn—Mg—O-based oxide semiconductor, a Sn—Mg—O-based oxide semiconductor, an In—Mg—O-based oxide semiconductor, and In—Ga—O-based oxide semiconductor which are oxides of two metal elements; an In—O-based oxide semiconductor; a Sn—O-based oxide semiconductor; and a Zn—O-based oxide semiconductor. Further, $SiO_2$ may be contained in the above oxide semiconductor. Note that here, for example, an In—Ga—Zn—O-based oxide semiconductor means an oxide film containing indium (In), gallium (Ga), and zinc (Zn) and there is no particular limitation on the stoichiometric proportion. The In—Ga—Zn—O-based oxide semiconductor may contain an element other than In, Ga, and Zn.

As the first oxide semiconductor layer, a thin film formed using a material expressed by a chemical formula of $InMO_3(ZnO)_m$ (m>0) can be used. Here, M represents one or more metal elements selected from Ga, Al, Mn, and Co. For example, M can be Ga, Ga and Al, Ga and Mn, Ga and Co, or the like.

In this embodiment, the first oxide semiconductor layer is formed by a sputtering method with the use of an In—Ga—Zn—O-based oxide target. Further, the first oxide semiconductor layer can be formed by a sputtering method in a rare gas (typically, argon) atmosphere, an oxygen atmosphere, or a mixed atmosphere of a rare gas and oxygen.

As a target used for forming an In—Ga—Zn—O film as the first oxide semiconductor layer by a sputtering method, for example, an oxide target having the following composition ratio can be used: $In_2O_3$:$Ga_2O_3$:ZnO is 1:1:1 [molar ratio]. Further, a material and a composition of the target are not limited to the above. For example, an oxide target having the following composition may be used: $In_2O_3$:$Ga_2O_3$:ZnO is 1:1:2 [molar ratio].

Further, the filling rate of the oxide target is higher than or equal to 90% and lower than or equal to 100%, preferably higher than or equal to 95% and lower than or equal to 99.9%. With the use of an oxide target with high filling rate, the resulting first oxide semiconductor layer has high density.

It is preferable that a high-purity gas from which an impurity such as hydrogen, water, a hydroxyl group, or a hydride is removed be used as the sputtering gas for the formation of the first oxide semiconductor layer.

For the formation of the first oxide semiconductor layer, it is preferable that the substrate 400 be held in a deposition chamber kept at reduced pressure and the substrate temperature be set to a temperature higher than or equal to 100° C. and lower than or equal to 600° C., preferably higher than or equal to 200° C. and lower than or equal to 400° C. The film formation is performed while the substrate 400 is heated, whereby the impurity concentration in the first oxide semiconductor layer can be reduced. In addition, damage caused by sputtering can be reduced. Then, a sputtering gas from which hydrogen or water is sufficiently removed is introduced into the deposition chamber from which remaining moisture is being removed, so that the first oxide semiconductor layer is formed over the substrate 400 with the use of the target. In order to remove moisture remaining in the deposition chamber, an entrapment vacuum pump such as a cryopump, an ion pump, or a titanium sublimation pump is preferably used. Further, an evacuation unit may be a turbo molecular pump provided with a cold trap. In the deposition chamber which is evacuated with the cryopump, for example, a hydrogen atom, a compound containing a hydrogen atom such as water ($H_2O$) (further preferably, also a compound containing a carbon atom), and the like are removed, whereby the impurity concentration in the first oxide semiconductor layer formed in the deposition chamber can be reduced.

As an example of the deposition condition, the distance between the substrate and the target is 100 mm, the pressure is 0.6 Pa, the direct-current (DC) power source is 0.5 kW, and the atmosphere is an oxygen atmosphere (the proportion of the oxygen flow rate is 100%). Note that a pulsed direct-current power supply is preferably used, in which case powder substances (also referred to as particles or dust) that are generated in deposition can be reduced and the film thickness can be uniform.

After that, heat treatment (first heat treatment) is performed on the first oxide semiconductor layer to crystallize at least a region including a surface of the first oxide semiconductor layer, whereby the first oxide semiconductor layer 403 is formed. By the first heat treatment, excessive hydrogen (including water and a hydroxyl group) in the first oxide semiconductor layer can be removed and a structure of the first oxide semiconductor layer can be ordered. Moreover, excessive hydrogen (including water and a hydroxyl group) in the gate insulating layer 402 can also be removed through the first heat treatment. The first heat treatment is performed at a temperature higher than or equal to 450° C. and lower than or equal to 850° C. In addition, heating time is longer than or equal to 1 minute and shorter than or equal to 24 hours.

The crystalline region formed in the region including the surface is formed by crystal growth from the surface toward the inside. The crystalline region includes plate-like crystals whose average thickness is greater than or equal to 2 nm and less than or equal to 10 nm. The crystalline region includes a crystal whose a-b plane is parallel to the surface and whose c-axis is aligned in a direction substantially perpendicular to the surface. Here, "substantially perpendicular" means a state within ±10° from a perpendicular direction.

The heat treatment can be performed in such a way that, for example, an object is introduced into an electric furnace in which a resistance heating element or the like is used, and heated at 450° C. in a nitrogen atmosphere for an hour. During the heat treatment, the first oxide semiconductor layer is not exposed to the air to prevent the entry of water and hydrogen.

The heat treatment apparatus is not limited to the electric furnace and may be an apparatus for heating an object by thermal radiation or thermal conduction from a medium such as a heated gas. For example, a rapid thermal anneal (RTA) apparatus such as a gas rapid thermal anneal (GRTA) apparatus or a lamp rapid thermal anneal (LRTA) apparatus can be used. An LRTA apparatus is an apparatus for heating an object by radiation of light (an electromagnetic wave) emitted from a lamp such as a halogen lamp, a metal halide lamp, a xenon arc lamp, a carbon arc lamp, a high pressure sodium lamp, or a high pressure mercury lamp. A GRTA apparatus is an apparatus for performing heat treatment using a high-temperature gas. As the gas, an inert gas which does not react with an object by heat treatment, for example, nitrogen or a rare gas such as argon is used.

For example, as the first heat treatment, a GRTA process may be performed as follows. The object is put in an inert gas atmosphere that has been heated, heated for several minutes, and taken out from the inert gas atmosphere. The GRTA process enables high-temperature heat treatment for a short time. Moreover, the GRTA process can be employed even when the temperature exceeds the upper temperature limit of the object. Note that the inert gas may be changed to a gas including oxygen during the process. This is because defect levels in the energy gap due to oxygen vacancy can be decreased by performing the first heat treatment in an atmosphere containing oxygen.

Note that as the inert gas atmosphere, an atmosphere that contains nitrogen or a rare gas (e.g., helium, neon, or argon) as its main component and does not contain water, hydrogen, or the like is preferably used. For example, the purity of nitrogen or a rare gas such as helium, neon, or argon introduced into the heat treatment apparatus is greater than or equal to 6 N (99.9999%), preferably greater than or equal to 7 N (99.99999%) (that is, the impurity concentration is less than or equal to 1 ppm, preferably less than or equal to 0.1 ppm).

The above heat treatment (first heat treatment) can be referred to as dehydration treatment, dehydrogenation treatment, or the like because of its effect of removing hydrogen, water, and the like.

The gate insulating layer 402 in contact with the first oxide semiconductor layer 403 has been subjected to oxygen doping treatment or the like and accordingly includes an oxygen excess region. Thus, transfer of oxygen from the first oxide semiconductor layer 403 to the gate insulating layer 402 can be suppressed. In addition, the first oxide semiconductor layer 403 is formed in contact with the gate insulating layer 402 to which oxygen has been supplied, whereby oxygen can be supplied from the gate insulating layer 402 to the first oxide semiconductor layer 403.

The oxygen supply from the gate insulating layer 402 including an oxygen-excess region to the first oxide semiconductor layer 403 is further promoted by performance of heat treatment in the state where the gate insulating layer 402 is in contact with the first oxide semiconductor layer 403. At least part of oxygen which has been added to the gate insulating layer 402 and supplied to the first oxide semiconductor layer 403 preferably has a dangling bond in the oxide semiconductor. This is because the dangling bond can be bonded with hydrogen left in the oxide semiconductor layer to immobilize hydrogen (make hydrogen an immovable ion).

Next, a second oxide semiconductor layer is formed over the first oxide semiconductor layer 403 which includes the crystalline region in the region including at least the surface.

Note that it is preferable that the second oxide semiconductor layer be formed using a material containing the same main component as the first oxide semiconductor layer 403 or have the same crystal structure as the first oxide semiconductor layer 403 and lattice constants close to those of the first oxide semiconductor layer 403 (lattice mismatch is less than or equal to 1%). Alternatively, the first oxide semiconductor layer 403 and the second oxide semiconductor layer may be formed using materials having different main components.

In the case of using materials including the same main component, crystal growth is easily caused in later crystallization of the second oxide semiconductor layer because the crystal region in the first oxide semiconductor layer 403 serves as a seed. In addition, since the thickness can be increased, using materials including the same main component is suitable for the application to power devices or the like. Further, in the case of using materials including the same main component, favorable interface characteristics such as adhesiveness or favorable electrical characteristics can be obtained.

In this embodiment, the second oxide semiconductor layer is formed by a sputtering method with the use of an In—Ga—Zn—O-based oxide semiconductor target. The deposition of the second oxide semiconductor layer by a sputtering method may be conducted in a manner similar to the above-described deposition of the first oxide semiconductor layer by a sputtering method. Note that the thickness of the second oxide semiconductor layer is preferably larger than that of the first oxide semiconductor layer 403. The second oxide semiconductor layer is preferably formed so that the sum of the thickness of the first oxide semiconductor layer 403 and that of the second oxide semiconductor layer is greater than or equal to 3 nm and less than or equal to 50 nm. The thickness in the above range is preferable because when the sum of the thickness of the first oxide semiconductor layer 403 and that of the second oxide semiconductor layer is too large (for example, when the total thickness is greater than or equal to 50 nm), the transistor might be normally on. In the above thickness range, the sum of the thickness might be beyond a preferable range of optical thickness; electrical characteristics may be prioritized. This is because an effect can be obtained by adjustment of the thickness of a film other than the oxide semiconductor film.

Figure 12B:
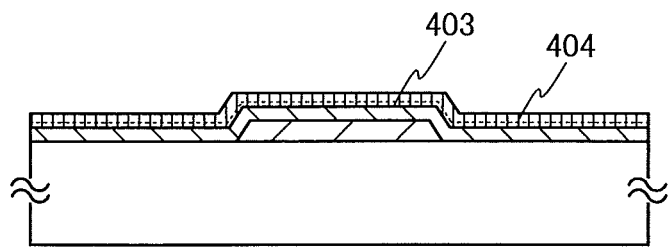

Next, the second heat treatment is performed on the second oxide semiconductor layer to cause crystal growth using the crystal region of the first oxide semiconductor layer 403 as a seed crystal, so that a second oxide semiconductor layer 404 is formed (see FIG. 12B).

The temperature of the second heat treatment is higher than or equal to 450° C. and lower than or equal to 850° C., preferably higher than or equal to 600° C. and lower than or equal to 700° C. The time for the second heat treatment is longer than or equal to 1 minute and shorter than or equal to 100 hours, preferably longer than or equal to 5 hours and shorter than or equal to 20 hours, and typically 10 hours.

The second heat treatment is performed, whereby the entire region of the second oxide semiconductor layer is crystallized from the crystalline region formed in the vicinity of the interface between the second oxide semiconductor layer and the first oxide semiconductor layer 403; thus, the second oxide semiconductor layer 404 can be formed. Further, by the second heat treatment, the crystalline layer of the first oxide semiconductor layer 403 can have higher orientation.

For example, in the case where an In—Ga—Zn—O-based oxide semiconductor material is used for the second oxide semiconductor layer 404, the second oxide semiconductor layer 404 can include a crystal represented by $InGaO_3(ZnO)_m$ (m is an integer number), a crystal represented by $In_2Ga_2ZnO_7$ (In:Ga:Zn:O=2:2:1:7), or the like. Such a crystal is oriented so that the c-axis is in a substantially perpendicular direction to a surface of the second oxide semiconductor layer 404 by the second heat treatment.

Here, the above-described crystal includes any of In, Ga, and Zn, and can be considered to have a layered structure of layers parallel to the a-axis and the b-axis. Specifically, the above-described crystal has a structure in which a layer including In and a layer not including In (a layer including Ga or Zn) are stacked in a c-axis direction.

In the In—Ga—Zn—O-based oxide semiconductor crystal, the conductivity of the layer including In in a direction parallel to the a-axis and the b-axis is favorable. This is due to the fact that electric conductivity is mainly controlled by In in the In—Ga—Zn—O-based oxide semiconductor crystal and the fact that the 5s orbital of one In atom overlaps the 5s orbital of an adjacent In atom and thereby a carrier path is formed.

In the case where the first oxide semiconductor layer 403 includes an amorphous region in the vicinity of the interface between the first oxide semiconductor layer 403 and the gate insulating layer 402, the second heat treatment may cause crystal growth from the crystalline region formed on the surface of the first oxide semiconductor layer 403 toward the bottom surface of the first oxide semiconductor layer and may crystallize the amorphous region in some cases. Note that the amorphous region is left in some cases depending on the material included in the gate insulating layer 402, the conditions of the heat treatment, or the like.

In the case where the first oxide semiconductor layer 403 and the second oxide semiconductor layer are formed using oxide semiconductor materials including the same main component, crystal growth occurs upward to the surface of the second oxide semiconductor layer, in which the first oxide semiconductor layer 403 serves as a seed crystal of the crystal growth, so that the second oxide semiconductor layer 404 is formed. The first oxide semiconductor layer 403 and the second oxide semiconductor layer 404 have the same crystal structure. For that reason, although shown by dot lines in FIGS. 12B to 12E, the interface between the first oxide semiconductor layer 403 and the second oxide semiconductor layer 404 cannot be recognized and the first oxide semiconductor layer 403 and the second oxide semiconductor layer 404 can be regarded as one layer in some cases. Therefore, a combination of the first oxide semiconductor layer 403 and the second oxide semiconductor layer 404 is referred to as the oxide semiconductor layer 409.

Note that the heat treatment apparatus used for the second heat treatment can be used under conditions similar to those of the first heat treatment.

Figure 12C:
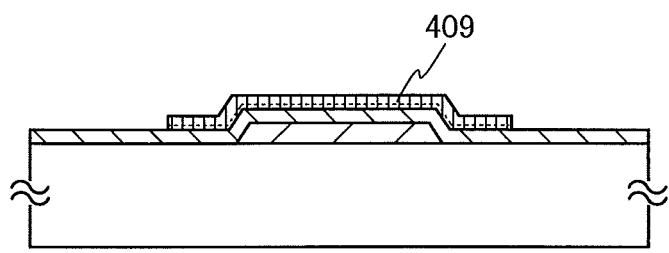

Next, a resist mask is formed over the oxide semiconductor layer 409 by a second photolithography step, and the oxide semiconductor layer 409 is selectively etched to form the island-shape oxide semiconductor layer 409; then, the resist mask is removed (FIG. 12C). A resist mask used for forming the island-shaped oxide semiconductor layer 409 may be formed by an inkjet method. Formation of the resist mask by an inkjet method needs no photomask; thus, manufacturing cost can be reduced. For the etching of the oxide semiconductor layer 409, dry etching, wet etching, or both of them may be employed.

Next, a conductive film for forming the source electrode and the drain electrode (including a wiring formed using the same layer as the source electrode and the drain electrode) is formed over the gate insulating layer 402 and the oxide semiconductor layer 409. As the conductive film used for the source electrode and the drain electrode, for example, a metal film containing an element selected from Al, Cr, Cu, Ta, Ti, Mo, and W, a metal nitride film containing any of the above elements as its component (e.g., a titanium nitride film, a molybdenum nitride film, or a tungsten nitride film), or the like can be used. A metal film having a high melting point such as Ti, Mo, W, or the like or a metal nitride film of any of these elements (a titanium nitride film, a molybdenum nitride film, and a tungsten nitride film) may be stacked on one of or both a lower side and an upper side of a metal film of Al, Cu, or the like. Further, the conductive film used for the source electrode and the drain electrode may be formed using a conductive metal oxide. As conductive metal oxide, indium oxide ($In_2O_3$), tin oxide ($SnO_2$), zinc oxide (ZnO), indium oxide-tin oxide alloy ($In_2O_3$—$SnO_2$; abbreviated to ITO), indium oxide-zinc oxide alloy ($In_2O_3$—ZnO), or any of these metal oxide materials in which silicon oxide is contained can be used. In particular, when the conductive metal oxide is provided between the oxide semiconductor layer 409 and the metal film or the metal nitride film, interface characteristics can be favorable, and resistance can be further reduced.

Figure 12D:
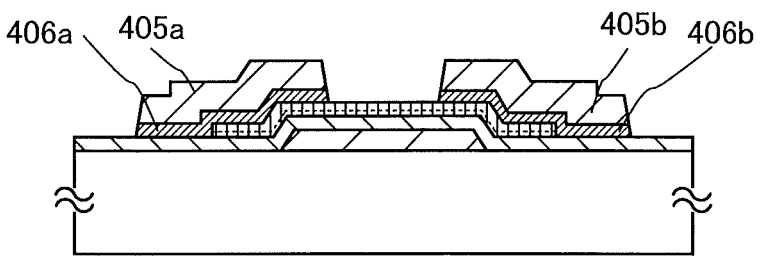

Through a third photolithography step, a resist mask is formed over the conductive film and selective etching is performed, so that the source electrode formed of the first conductive layer 406a and the second conductive layer 405a and the drain electrode formed of the first conductive layer 406b and the second conductive layer 405b are formed. Then, the resist mask is removed (FIG. 12D). Light exposure at the time of the formation of the resist mask in the third photolithography step may be performed using ultraviolet light, KrF laser light, or ArF laser light. The channel length L of a transistor that is to be completed later is determined by a distance between bottom edges of the source electrode formed of the first conductive layer 406a and the second conductive layer 405a and the drain electrode formed of the first conductive layer 406b and the second conductive layer 405b, which are adjacent to each other over the oxide semiconductor layer 409. When light exposure is performed for a channel length L smaller than 25 nm, the light exposure for forming the resist mask in the third photolithography step may be performed using extreme ultraviolet light having an extremely short wavelength of several nanometers to several tens of nanometers, for example. In the light exposure by extreme ultraviolet light, the resolution is high and the focal depth is large. Thus, the channel length L of the transistor formed later can be reduced, whereby the operation speed of a circuit can be increased.

In order to reduce the number of photomasks used in a photolithography step and reduce the number of steps, an etching step may be performed with the use of a multi-tone mask which is a light-exposure mask through which light is transmitted to have a plurality of intensities. A resist mask formed with the use of a multi-tone mask has a plurality of thicknesses and further can be changed in shape by etching; therefore, the resist mask can be used in a plurality of etching steps for processing into different patterns. Therefore, a resist mask corresponding to at least two kinds or more of different patterns can be formed by one multi-tone mask. Thus, the number of light-exposure masks can be reduced and the number of corresponding photolithography steps can be also reduced, whereby simplification of a process can be realized.

Note that when the conductive film is etched, it is desirable that the etching condition be optimized so that the oxide semiconductor layer 409 can be prevented from being divided by etching. However, it is difficult to obtain such an etching condition under which only the conductive film is etched and the oxide semiconductor layer 409 is not etched at all. In some cases, only part of the oxide semiconductor layer 409, e.g., 5% to 50% in thickness of the oxide semiconductor layer 409 is etched when the conductive film is etched, whereby the oxide semiconductor layer 409 having a groove portion (a recessed portion) is formed.

In the case where the conductive an has a layered structure, an uneven shape may be provided.

Figure 12E:
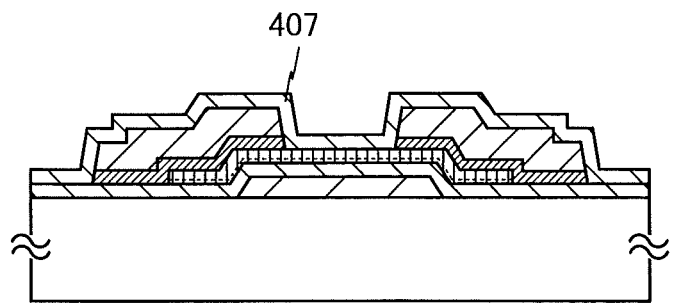

Next, plasma treatment may be performed using a gas such as $N_2O$, $N_2$, or Ar so that water adsorbed to a surface of an exposed portion of the oxide semiconductor layer 409 is removed. In the case where plasma treatment is performed, the protective insulating film 407 which is to be in contact with the oxide semiconductor layer 409 is desirably formed without being exposed to the air, following the plasma treatment (FIG. 12E).

The protective insulating film 407 can be formed using a material and a method which are similar to those of the gate insulating layer 402. In order to keep a favorable state at the interface with the oxide semiconductor layer, the protective insulating film 407 is preferably formed using a material similarly to that of the gate insulating layer 402. As the protective insulating film, a layered structure which includes a plurality of materials having different refractive indexes may be used.

Next, treatment for supplying oxygen such as oxygen doping treatment is preferably performed on the protective insulating film 407. Note that an oxygen gas or a mixed gas containing an inert gas (e.g., nitrogen or a rare gas such as argon) and oxygen may be introduced during the deposition of the protective insulating film 407 by a sputtering method in order to supply oxygen to the protective insulating film 407.

After that, third heat treatment is preferably performed in the state where part of the oxide semiconductor layer 409 (channel formation region) is in contact with the protective insulating film 407. The third heat treatment is performed at a temperature higher than or equal to 250° C. and lower than or equal to 700° C., preferably higher than or equal to 450° C. and lower than or equal to 600° C. or lower than the strain point of the substrate.

The third heat treatment may be performed in an atmosphere of nitrogen, oxygen, ultra-dry air (air in which a water content is less than or equal to 20 ppm, preferably less than or equal to 1 ppm, more preferably less than or equal to 10 ppb), or a rare gas (argon, helium, or the like). Note that it is preferable that water, hydrogen, or the like be not contained in the atmosphere of nitrogen, oxygen, ultra-dry air, a rare gas, or the like. It is also preferable that the purity of nitrogen, oxygen, or the rare gas which is introduced into the heat treatment apparatus be greater than or equal to 6N (99.9999%), preferably greater than or equal to 7N (99.99999%) (that is, the impurity concentration is less than or equal to 1 ppm, preferably less than or equal to 0.1 ppm).

The third heat treatment is performed in the state where the oxide semiconductor layer 409 is in contact with the gate insulating layer 402 and the protective insulating film 407. Thus, oxygen which is one of main components of the oxide semiconductor and might be reduced due to the dehydration (or dehydrogenation) treatment can be supplied from the gate insulating layer 402 and the protective insulating film 407 each containing oxygen to the oxide semiconductor layer 409. Accordingly, a charge trapping center in the oxide semiconductor layer 409 can be decreased. Through the above steps, the oxide semiconductor layer 409 can be highly purified to be electrically i-type (intrinsic).

By performing the third heat treatment as described above, the oxide semiconductor layer 409 can be highly purified so as not to contain impurities other than main components as little as possible. The highly-purified oxide semiconductor layer 409 contains extremely few (close to zero) carriers derived from a donor, and the carrier concentration thereof is lower than $1\times10^{14}/cm^3$, preferably lower than $1\times10^{12}/cm^3$, further preferably lower than $1\times10^{11}/cm^3$.

Through the above steps, the transistor 310 is completed. The thus obtained transistor 310 includes the oxide semiconductor layer 409 which is a highly purified layer from which an impurity such as hydrogen, water, a hydroxyl group, or a hydride (also referred to as a hydrogen compound) is intentionally removed. In addition, by the adjustment of the thickness of each layer in a portion corresponding to a light path to a prescribed thickness according to one embodiment of the present invention, a structure with a high reflectance in a wavelength region that becomes the cause of light degradation can be provided. As a result, the amount of light absorbed by the channel portion of the oxide semiconductor layer 409 can be reduced and an effect of reducing light degradation can be obtained. Therefore, variation in the electrical characteristics of the transistor 310 is suppressed and the transistor 310 is electrically stable.

Further, a planarization insulating film may be formed over the transistor 310. The planarization insulating film can be formed using a heat-resistant organic material such as acrylic, polyimide, benzocyclobutene, polyamide, or epoxy. As an alternative to such organic materials, it is also possible to use a low-dielectric constant material (a low-k material), a siloxane-based resin, phosphosilicate glass (PSG), borophosphosilicate glass (BPSG), or the like. Note that the planarization insulating film may be formed by stacking a plurality of insulating films formed of any of these materials.

As described in this embodiment, by the adjustment of the thickness of each layer in the portion corresponding to the light path when light enters the channel portion of the oxide semiconductor layer 409 so that the finished thickness is the prescribed thickness, the amount of light absorbed by the channel portion of the oxide semiconductor layer 409 can be reduced and an effect of reducing light degradation can be obtained.

In the case in which the insulating film in contact with the oxide semiconductor layer includes a region where the proportion of oxygen is higher than that in the stoichiometric composition, oxygen which might be reduced through dehydration (or dehydrogenation) treatment on the oxide semiconductor layer can be supplied to the oxide semiconductor layer. Accordingly, oxygen vacancy in the oxide semiconductor layer can be reduced; thus, a charge trapping center in the oxide semiconductor layer can be decreased. Through the above steps, the oxide semiconductor layer can be highly purified to be electrically i-type (intrinsic).

In the semiconductor device according to one embodiment of the present invention, the oxide semiconductor layer in which the hydrogen concentration is sufficiently reduced so that the oxide semiconductor layer is highly purified and in which defect levels in the energy gap due to oxygen deficiency are reduced by sufficient supply of oxygen is used as an active layer, whereby the off-state current density of the transistor can be lower than or equal to 10 zA/μm, preferably lower than or equal to 1 zA/μm, more preferably lower than or equal to 1 yA/μm, which depends on the voltage between the source electrode and drain electrode. Accordingly, the transistor including the highly purified oxide semiconductor layer as an active layer has much lower off-state current than a transistor including silicon having crystallinity.

In the oxide semiconductor layer in which defect levels in the energy gap due to oxygen deficiency are reduced by sufficient supply of oxygen, the carrier concentration is sufficiently low. With the use of such an oxide semiconductor layer as an active layer, a shift in threshold voltage of the transistor can be suppressed and the transistor can be normally off.

As described above, according to one embodiment of the present invention, a semiconductor device including an oxide semiconductor and having stable electrical characteristics can be provided. Therefore, a semiconductor device with high reliability can be provided.

The structures, methods, and the like described in this embodiment can be combined as appropriate with any of the structures, methods, and the like described in the other embodiments.

Embodiment 3

A semiconductor device (also referred to as a display device) with a display function can be manufactured using any of the transistors exemplified in Embodiment 1 and Embodiment 2. Moreover, some or all of the driver circuits which include the transistors can be formed over a substrate where the pixel portion is formed, whereby a system-on-panel can be obtained.

Figure 13A:
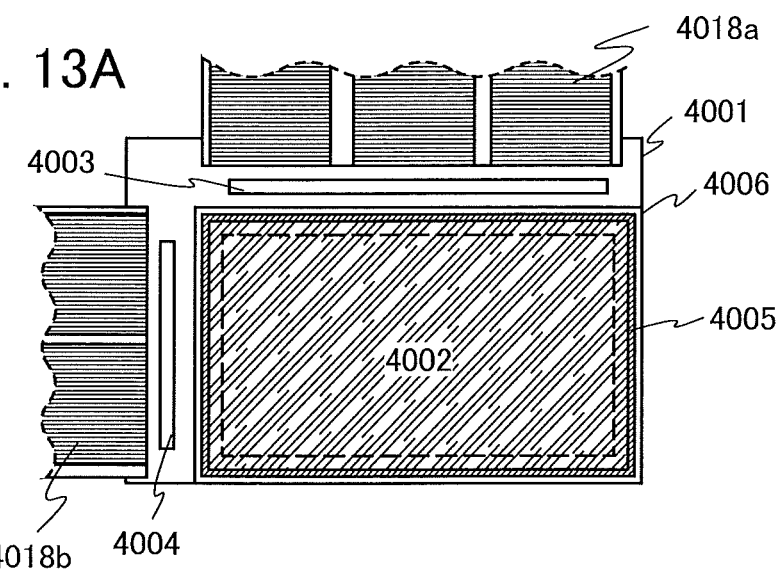
FIGS. 13A to 13C illustrate one embodiment of a semiconductor device.

In FIG. 13A, a sealant 4005 is provided so as to surround a pixel portion 4002 provided over a first substrate 4001, and the pixel portion 4002 is sealed between the first substrate 4001 and a second substrate 4006. In FIG. 13A, a signal line driver circuit 4003 and a scan line driver circuit 4004 which are formed using a single crystal semiconductor film or a polycrystalline semiconductor film over a substrate separately prepared are mounted over the first substrate 4001, in a region that is different from the region surrounded by the sealant 4005. Various signals and potential are supplied to the signal line driver circuit 4003 and the scan line driver circuit 4004 which are separately formed and to the pixel portion 4002 from flexible printed circuits (FPCs) 4018a and 4018b.

Figure 13B:
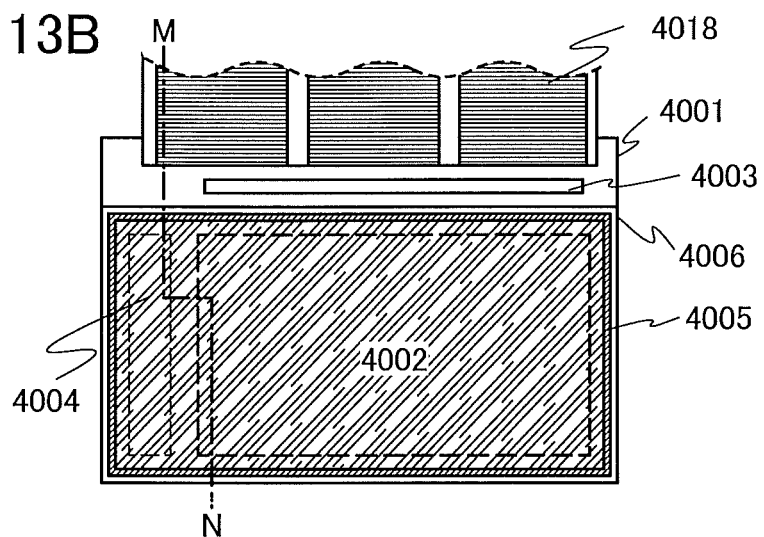
Figure 13C:
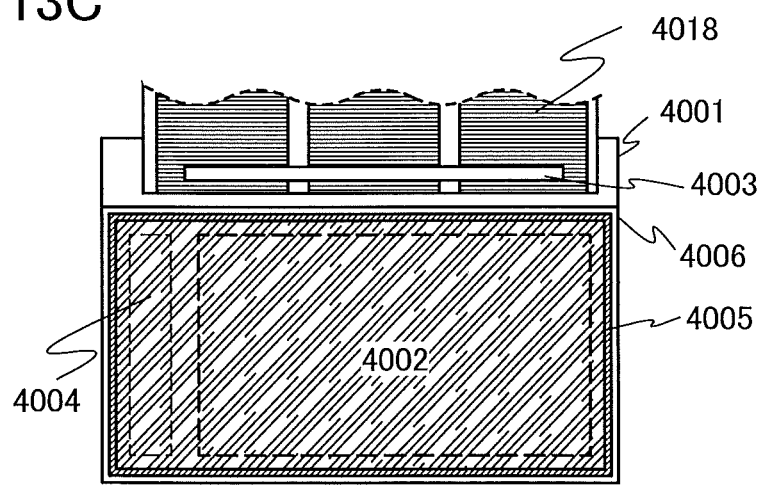

In FIGS. 13B and 13C, the sealant 4005 is provided so as to surround the pixel portion 4002 and the scan line driver circuit 4004 which are provided over the first substrate 4001. The second substrate 4006 is provided over the pixel portion 4002 and the scan line driver circuit 4004. Consequently, the pixel portion 4002 and the scan line driver circuit 4004 are sealed together with a display element, by the first substrate 4001, the sealant 4005, and the second substrate 4006. In FIGS. 13B and 13C, the signal line driver circuit 4003 which is formed using a single crystal semiconductor film or a polycrystalline semiconductor film over a substrate separately prepared is mounted over the first substrate 4001, in a region that is different from the region surrounded by the sealant 4005. In FIGS. 13B and 13C, various signals and potential are supplied to the signal line driver circuit 4003 which is separately formed, the scan line driver circuit 4004, and the pixel portion 4002 from an FPC 4018.

Although FIGS. 13B and 13C each illustrate an example in which the signal line driver circuit 4003 is formed separately and mounted on the first substrate 4001, the display device according to the present invention is not limited to this structure. The scan line driver circuit may be separately formed and then mounted, or only part of the signal line driver circuit or only part of the scan line driver circuit may be separately formed and then mounted.

Note that there is no particular limitation on a connection method of a separately formed driver circuit, and a chip on glass (COG) method, a wire bonding method, a tape automated bonding (TAB) method, or the like can be used. FIG. 13A illustrates an example in which the signal line driver circuit 4003 and the scan line driver circuit 4004 are mounted by a COG method. FIG. 13B illustrates an example in which the signal line driver circuit 4003 is mounted by a COG method. FIG. 13C illustrates an example in which the signal line driver circuit 4003 is mounted by a TAB method.

In addition, the display device includes a panel in which the display element is sealed, and a module in which an IC and the like including a controller are mounted on the panel.

Note that a display device in this specification means an image display device, a display device, or a light source (including a lighting device). Furthermore, the display device also includes the following modules in its category: a module to which a connector such as an FPC, a TAB tape, or a TCP is attached; a module having a TAB tape or a TCP at the tip of which a printed wiring board is provided; and a module in which an integrated circuit (IC) is directly mounted on a display element by a COG method.

Further, the pixel portion and the scan line driver circuit which are provided over the first substrate include a plurality of transistors and any of the transistors exemplified in Embodiment 1 and Embodiment 2 can be used therefor.

As the display element provided in the display device, a liquid crystal element (also referred to as a liquid crystal display element) or a light-emitting element (also referred to as a light-emitting display element) can be used. The light-emitting element includes, in its category, an element whose luminance is controlled by current or voltage, and specifically includes, in its category, an inorganic electroluminescent (EL) element, an organic EL element, and the like. Furthermore, a display medium whose contrast is changed by an electric effect, such as electronic ink, can be used.

Figure 14:
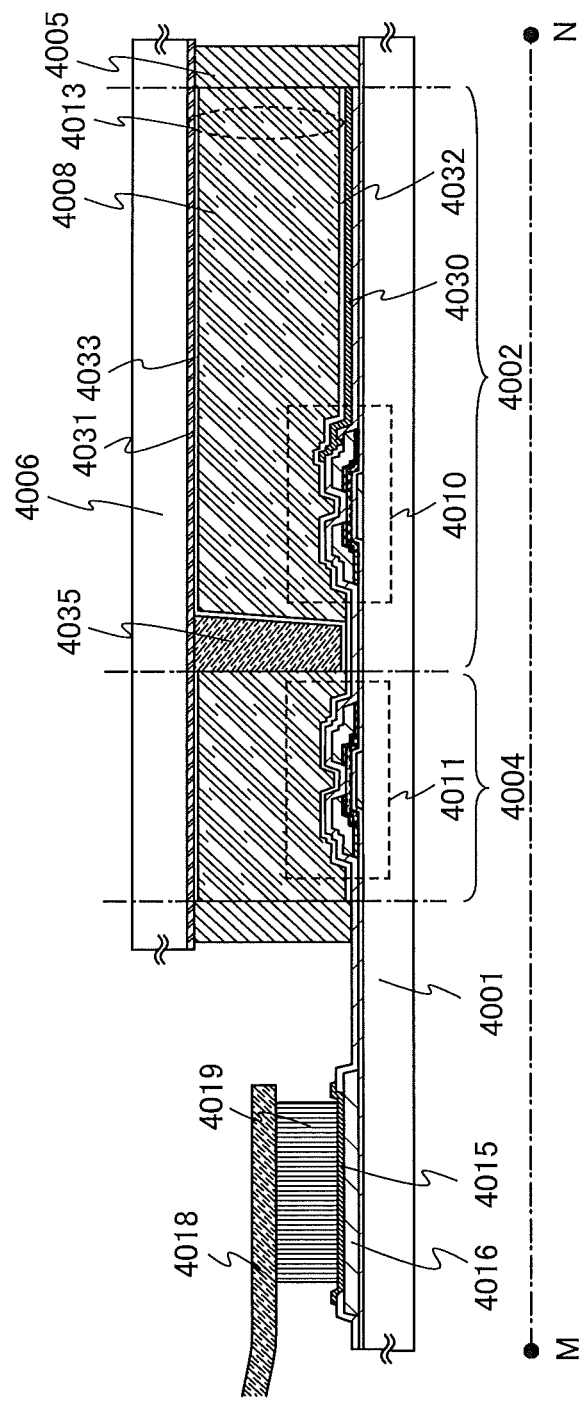
FIG. 14 illustrates one embodiment of a semiconductor device.

One embodiment of the semiconductor device is described with reference to FIG. 14. FIG. 14 corresponds to a cross-sectional view taken along line M-N in FIG. 13B.

As illustrated in FIG. 14, the semiconductor device includes a connection terminal electrode 4015 and a terminal electrode 4016. The connection terminal electrode 4015 and the terminal electrode 4016 are electrically connected to a terminal included in the FPC 4018 through an anisotropic conductive film 4019.

The connection terminal electrode 4015 is formed from the same conductive film as a first electrode layer (a first electrode) 4030. The terminal electrode 4016 is formed from the same conductive film as a source electrode and a drain electrode of transistors 4010 and 4011.

Each of the pixel portion 4002 and the scan line driver circuit 4004 which are provided over the first substrate 4001 includes a plurality of transistors. In FIG. 14, the transistor 4010 included in the pixel portion 4002 and the transistor 4011 included in the scan line driver circuit 4004 are illustrated as an example.

In this embodiment, any of the transistors described in Embodiment 1 and Embodiment 2 can be applied to the transistors 4010 and 4011. Note that an example in which the transistor 310 described in Embodiment 1 and Embodiment 2 is used is illustrated in FIG. 14; however, this embodiment is not limited to this example. The transistor 320, 330, 340, 350, 360, or the like may be used instead of the transistor 310, as appropriate. In addition, the transistors 4010 and 4011 do not necessarily need to have the same structure. Variation in the electrical characteristics of the transistors 4010 and 4011 is suppressed and the transistors 4010 and 4011 are electrically stable. Thus, as the semiconductor devices of this embodiment illustrated in FIG. 14, a semiconductor device with high reliability can be obtained.

The transistor 4010 included in the pixel portion 4002 is electrically connected to a display element to form a display panel. There is no particular limitation on the kind of display element as long as display can be performed, and a variety of kinds of display elements can be employed.

An example of a liquid crystal display device using a liquid crystal element as a display element is illustrated in FIG. 14. In FIG. 14, a liquid crystal element 4013 which is a display element includes the first electrode layer 4030, a second electrode layer (a second electrode) 4031, and a liquid crystal layer 4008. Insulating films 4032 and 4033 serving as alignment films are provided so that the liquid crystal layer 4008 is interposed therebetween. The second electrode layer 4031 is provided on the second substrate 4006 side, and the first electrode layer 4030 and the second electrode layer 4031 are stacked, with the liquid crystal layer 4008 interposed therebetween.

Reference numeral 4035 is a spacer formed using an insulating film and is provided in order to control the thickness of the liquid crystal layer 4008 (a cell gap). Alternatively, a spherical spacer may also be used.

In the case where a liquid crystal element is used as the display element, thermotropic liquid crystal, low-molecular liquid crystal, high-molecular liquid crystal, polymer dispersed liquid crystal, ferroelectric liquid crystal, anti-ferroelectric liquid crystal, or the like can be used. These liquid crystal materials exhibit a cholesteric phase, a smectic phase, a cubic phase, a chiral nematic phase, an isotropic phase, or the like depending on conditions.

Alternatively, liquid crystal exhibiting a blue phase for which an alignment film is unnecessary may be used. A blue phase is one of liquid crystal phases, which is generated just before a cholesteric phase changes into an isotropic phase while temperature of cholesteric liquid crystal is increased. Since the blue phase appears only in a narrow temperature range, a liquid crystal composition in which 5 wt. % or more of a chiral agent is mixed is used for the liquid crystal layer in order to improve the temperature range. The liquid crystal composition which includes liquid crystal exhibiting a blue phase and a chiral agent has a short response time of less than or equal to 1 msec, has optical isotropy, which makes the alignment process unneeded and viewing angle dependence small. In addition, since an alignment film does not need to be provided and thus rubbing treatment is unnecessary, electrostatic discharge damage caused by the rubbing treatment can be prevented and defects and damage of the liquid crystal display device in the manufacturing process can be reduced. Thus, productivity of the liquid crystal display device can be increased.

The specific resistivity of the liquid crystal material is greater than or equal to $1\times10^9$ Ω·cm, preferably greater than or equal to $1\times10^{11}$ Ω·cm, further preferably greater than or equal to $1\times10^{12}$ Ω·cm. The value of the specific resistivity in this specification is measured at 20° C.

The size of a storage capacitor formed in the liquid crystal display device is set in consideration of the leakage current of the transistor provided in the pixel portion or the like so that charge can be held for a predetermined period. By using the transistor including the highly-purified oxide semiconductor layer, it is enough to provide a storage capacitor having capacitance that is less than or equal to ⅓, preferably less than or equal to ⅕ of liquid crystal capacitance of each pixel.

In the transistor including the highly-purified oxide semiconductor film of this embodiment, the current in an off state (the off-state current) can be made low. Accordingly, an electrical signal such as an image signal can be held for a longer period, and an interval between writing operations can be set longer in an on state. Accordingly, frequency of refresh operation can be reduced, which leads to an effect of suppressing power consumption.

In addition, the transistor including the highly-purified oxide semiconductor layer of this embodiment can have relatively high field-effect mobility and thus can operate at high speed. Therefore, by using the transistor in a pixel portion of a liquid crystal display device, a high-quality image can be provided. In addition, since the above transistor can be provided in each of a driver circuit portion and a pixel portion provided over one substrate, the number of components of the liquid crystal display device can be reduced.

For the liquid crystal display device, a twisted nematic (TN) mode, an in-plane-switching (IPS) mode, a fringe field switching (FFS) mode, an axially symmetric aligned microcell (ASM) mode, an optical compensated birefringence (OCB) mode, a ferroelectric liquid crystal (FLC) mode, an antiferroelectric liquid crystal (AFLC) mode, or the like can be used.

A normally black liquid crystal display device such as a transmissive liquid crystal display device utilizing a vertical alignment (VA) mode is preferable. The vertical alignment mode is a method of controlling alignment of liquid crystal molecules of a liquid crystal display panel, in which liquid crystal molecules are aligned perpendicular to a panel surface when no voltage is applied. Some examples are given as a vertical alignment mode. For example, a multi-domain vertical alignment (MVA) mode, a patterned vertical alignment (PVA) mode, an advanced super-view (ASV) mode, or the like can be employed. Moreover, it is possible to use a method called domain multiplication or multi-domain design, in which a pixel is divided into some regions (subpixels) and molecules are aligned in different directions in their respective regions.

In the display device, a black matrix (a light-blocking layer), an optical member (an optical substrate) such as a polarizing member, a retardation member, or an anti-reflection member, and the like are provided as appropriate. For example, circular polarization may be obtained by using a polarizing substrate and a retardation substrate. In addition, a backlight, a side light, or the like may be used as a light source.

In addition, it is possible to employ a time-division display method (also called a field-sequential driving method) with the use of a plurality of light-emitting diodes (LEDs) as a backlight. By employing a field-sequential driving method, color display can be performed without using a color filter.

As a display method in the pixel portion, a progressive method, an interlace method or the like can be employed. Further, color elements controlled in a pixel for color display are not limited to three colors: R, G, and B (R, G, and B correspond to red, green, and blue, respectively). For example, R, G, B, and W (W corresponds to white); or R, G, B, and one or more of yellow, cyan, magenta, and the like can be used. Further, the sizes of display regions may be different between respective dots of color elements. The present invention is not limited to the application to a display device for color display but can also be applied to a display device for monochrome display.

In FIG. 14, as the first substrate 4001 and the second substrate 4006, flexible substrates, for example, light-transmitting plastic substrates or the like can be used, as well as glass substrates. As plastic, a fiberglass-reinforced plastics (FRP) plate, a polyvinyl fluoride (PVF) film, a polyester film, or an acrylic resin film can be used. In addition, a sheet with a structure in which an aluminum foil is sandwiched between PVF films or polyester films can be used.

The display device displays an image by transmitting light from a light source or a display element. Therefore, the substrate and the thin films such as the insulating film and the conductive film provided for the pixel portion where light is transmitted have light-transmitting properties with respect to light in the visible-light wavelength range.

The first electrode layer and the second electrode layer (each of which may be called a pixel electrode layer, a common electrode layer, a counter electrode layer, or the like) for applying voltage to the display element may have light-transmitting properties or light-reflecting properties, depending on the direction in which light is extracted, the position where the electrode layer is provided, the pattern structure of the electrode layer, and the like.

For the first electrode layer 4030 and the second electrode layer 4031, a light-transmitting conductive material such as indium oxide containing tungsten oxide, indium zinc oxide containing tungsten oxide, indium oxide containing titanium oxide, indium tin oxide containing titanium oxide, indium tin oxide (hereinafter, referred to as ITO), indium zinc oxide, or indium tin oxide to which silicon oxide is added, can be used.

The first electrode layer 4030 and the second electrode layer 4031 can be formed using one or more kinds of materials selected from a metal such as tungsten (W), molybdenum (Mo), zirconium (Zr), hafnium (Hf), vanadium (V), niobium (Nb), tantalum (Ta), chromium (Cr), cobalt (Co), nickel (Ni), titanium (Ti), platinum (Pt), aluminum (Al), copper (Cu), or silver (Ag); an alloy of any of these metals; and a nitride of any of these metals.

A conductive composition containing a conductive high molecule (also referred to as a conductive polymer) can be used for the first electrode layer 4030 and the second electrode layer 4031. As the conductive high molecule, a so-called π-electron conjugated conductive polymer can be used. For example, polyaniline or a derivative thereof, polypyrrole or a derivative thereof, polythiophene or a derivative thereof, a copolymer of two or more of aniline, pyrrole, and thiophene or a derivative thereof, and the like can be given.

Since the transistor is easily broken owing to static electricity or the like, a protective circuit for protecting the driver circuit is preferably provided. The protective circuit is preferably formed using a nonlinear element.

As described above, by using any of the transistors described in Embodiment 1 and Embodiment 2, a semiconductor device with high reliability can be provided. Note that the transistors described in Embodiment 1 and Embodiment 2 can be applied to not only semiconductor devices having the display functions described above but also semiconductor devices having a variety of functions, such as a power device which is mounted on a power supply circuit, a semiconductor integrated circuit such as LSI, and a semiconductor device having an image sensor function of reading information of an object.

This embodiment can be implemented in appropriate combination with the structures described in the other embodiments.

Embodiment 4

A semiconductor device disclosed in this specification can be used for a variety of electronic devices (including game machines). Examples of electronic devices are a television set (also referred to as a television or a television receiver), a monitor of a computer or the like, a camera such as a digital camera or a digital video camera, a digital photo frame, a mobile phone handset (also referred to as a mobile phone or a mobile phone device), a portable game machine, a portable information terminal, an audio reproducing device, a large-sized game machine such as a pachinko machine, and the like. Examples of electronic devices each including the liquid crystal display device described in the above embodiment are described.

Figure 15A:
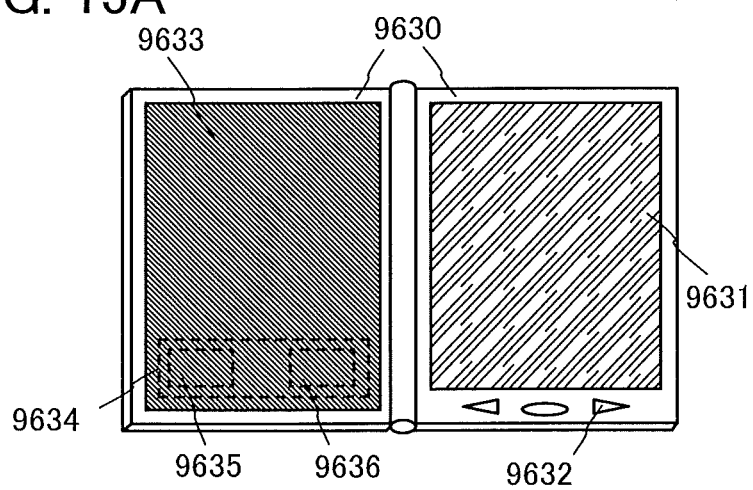
FIGS. 15A and 15B illustrate an example of an electronic device.

FIG. 15A illustrates an electronic book reader (also referred to as an e-book reader) which can include housings 9630, a display portion 9631, operation keys 9632, a solar cell 9633, and a charge and discharge control circuit 9634. The electronic book reader illustrated in FIG. 15A has a function of displaying various kinds of data (e.g., a still image, a moving image, and a text image), a function of displaying a calendar, a date, time, or the like on the display portion, a function of operating or editing the data displayed on the display portion, a function of controlling processing by various kinds of software (programs), and the like. Note that in FIG. 15A, a structure including a battery 9635 and a DCDC converter (hereinafter abbreviated as a converter) 9636 is illustrated as an example of the charge and discharge control circuit 9634. By applying the semiconductor device described in another embodiment to the display portion 9631, the electronic book reader can be highly reliable.

In the structure of FIG. 15A, a semi-transmissive or reflective liquid crystal display device is used for the display portion 9631, whereby the electronic book reader is excellent in visibility even in a relatively bright environment. In such an environment, power generation by the solar cell 9633 and charge of the battery 9635 can be efficiently performed. Note that the solar cell 9633 can be provided in not only the illustrated region but also a space (a surface or a rear surface) of the housing 9630, as appropriate. When a lithium ion battery is used as the battery 9635, there is an advantage of downsizing or the like.

Figure 15B:
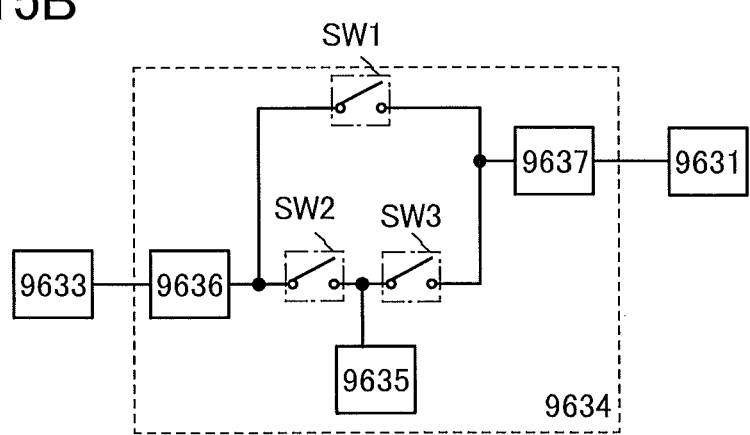

The structure and the operation of the charge and discharge control circuit 9634 illustrated in FIG. 15A will be described with reference to a block diagram in FIG. 15B. The solar cell 9633, the battery 9635, the converter 9636, a converter 9637, switches SW1 to SW3, and the display portion 9631 are illustrated in FIG. 15B. The battery 9635, the converter 9636, the converter 9637, and the switches SW1 to SW3 are included in the charge and discharge control circuit 9634.

First, an example of operation in the case where power is generated by the solar cell 9633 using external light is described. The voltage of power generated by the solar cell is raised or lowered by the converter 9636 to a suitable voltage for charging the battery 9635. Then, when the power from the solar cell 9633 is used for the operation of the display portion 9631, the switch SW1 is turned on and the voltage of the power is raised or lowered by the converter 9637 so as to be voltage needed for the display portion 9631. In addition, when display on the display portion 9631 is not performed, the switch SW1 is turned off and the switch SW2 is turned on so that charge of the battery 9635 may be performed.

Next, operation in the case where power is not generated by the solar cell 9633 owing to lack of external light is described. The voltage of power accumulated in the battery 9635 is raised or lowered by the converter 9637 by turning on the switch SW3. Then, power from the battery 9635 is used for the operation of the display portion 9631.

Note that the solar cell is described as one example of a means for charging, the battery 9635 may be charged with another means or with a combination of the solar cell and another means.

Figure 16A:
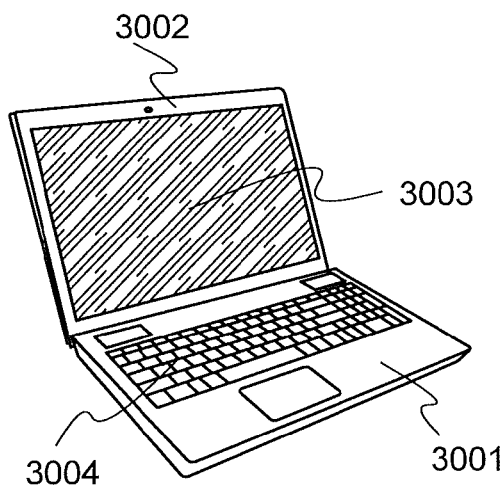
FIGS. 16A to 16F are views illustrating electronic devices.

FIG. 16A illustrates a laptop personal computer, which includes a main body 3001, a housing 3002, a display portion 3003, a keyboard 3004, and the like. By applying the semiconductor device described in Embodiments 1 to 3, the laptop personal computer can have high reliability.

Figure 16B:
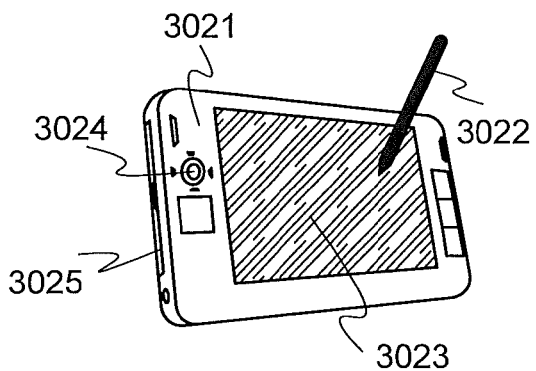

FIG. 16B illustrates a portable information terminal (PDA), which includes a display portion 3023, an external interface 3025, an operation button 3024, and the like in a main body 3021. A stylus 3022 is provided as an accessory for operation. By applying the semiconductor device described in Embodiments 1 to 3, the portable information terminal (PDA) can have higher reliability.

Figure 16C:
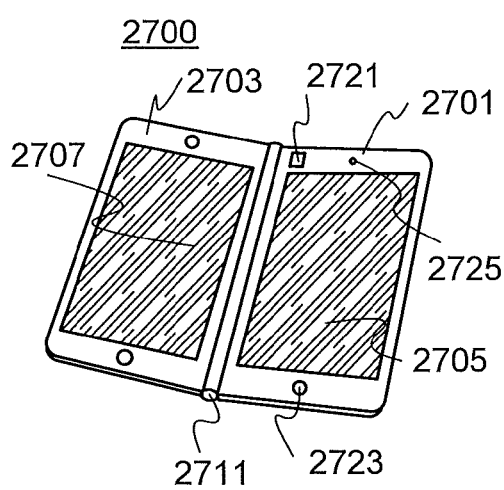

FIG. 16C illustrates an example of an electronic book reader. For example, an electronic book reader 2700 includes two housings, a housing 2701 and a housing 2703. The housing 2701 and the housing 2703 are combined with a hinge 2711 so that the electronic book reader 2700 can be opened and closed with the hinge 2711 as an axis. With such a structure, the electronic book reader 2700 can operate like a paper book.

A display portion 2705 and a display portion 2707 are incorporated in the housing 2701 and the housing 2703, respectively. The display portion 2705 and the display portion 2707 may display one image or different images. In the case where the display portion 2705 and the display portion 2707 display different images, for example, a display portion on the right side (the display portion 2705 in FIG. 16C) can display text and a display portion on the left side (the display portion 2707 in FIG. 16C) can display graphics. By applying the semiconductor device described in Embodiments 1 to 3, the electronic book reader 2700 can have high reliability.

Further, FIG. 16C illustrates an example in which the housing 2701 is provided with an operation portion and the like. For example, the housing 2701 is provided with a power switch 2721, operation keys 2723, a speaker 2725, and the like. With the operation keys 2723, pages can be turned. Note that a keyboard, a pointing device, or the like may also be provided on the surface of the housing, on which the display portion is provided. Furthermore, an external connection terminal (an earphone terminal, a USB terminal, or the like), a recording medium insertion portion, and the like may be provided on the back surface or the side surface of the housing. Moreover, the electronic book reader 2700 may have a function of an electronic dictionary.

The electronic book reader 2700 may have a configuration capable of wirelessly transmitting and receiving data. Through wireless communication, desired book data or the like can be purchased and downloaded from an electronic book server.

Figure 16D:
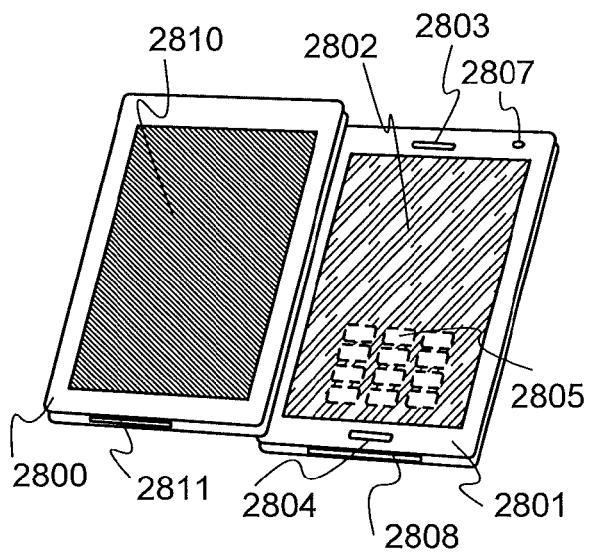

FIG. 16D illustrates a mobile phone, which includes two housings, a housing 2800 and a housing 2801. The housing 2801 includes a display panel 2802, a speaker 2803, a microphone 2804, a camera lens 2807, an external connection terminal 2808, and the like. In addition, the housing 2800 includes a solar cell 2810 having a function of charge of the portable information terminal, an external memory slot 2811, and the like. Further, an antenna is incorporated in the housing 2801. By applying the semiconductor device described in Embodiments 1 to 3, the mobile phone can have high reliability.

Further, the display panel 2802 is provided with a touch panel. A plurality of operation keys 2805 that are displayed as images are shown by dashed lines in FIG. 16D. Note that a boosting circuit by which voltage output from the solar cell 2810 is increased to be sufficiently high for each circuit is also included.

In the display panel 2802, the display direction can be appropriately changed depending on a usage pattern. Further, the camera lens 2807 is provided on the same surface as the display panel 2802, and thus it can be used as a video phone. The speaker 2803 and the microphone 2804 can be used for videophone calls, recording and playing sound, and the like as well as voice calls. Further, the housings 2800 and 2801 in a state where they are developed as illustrated in FIG. 16D can shift by sliding so that one is lapped over the other; therefore, the size of the mobile phone can be reduced, which makes the mobile phone suitable for being carried. Further, the housing 2800 can be held on the back side of the housing 2801, which is suitable for telephoning or the like.

The external connection terminal 2808 can be connected to an AC adapter and various types of cables such as a USB cable, and charging and data communication with a personal computer are possible. Moreover, a large amount of data can be stored by inserting a storage medium into the external memory slot 2811 and can be transferred.

Further, in addition to the above functions, an infrared communication function, a television reception function, or the like may be provided.

Figure 16E:
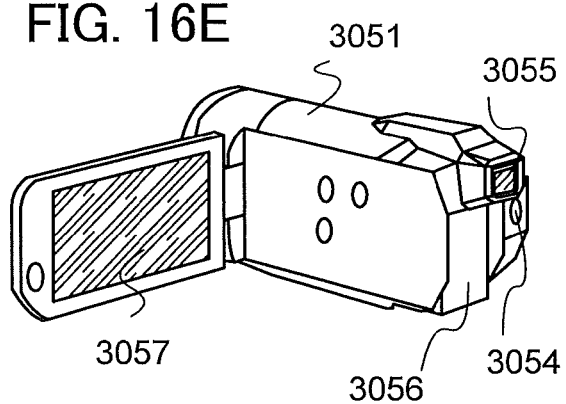

FIG. 16E illustrates a digital video camera, which includes a main body 3051, a display portion A 3057, an operation switch 3054, a display portion B 3055, a battery 3056, and the like. By applying the semiconductor device described in Embodiments 1 to 3, the digital video camera can have high reliability.

Figure 16F:
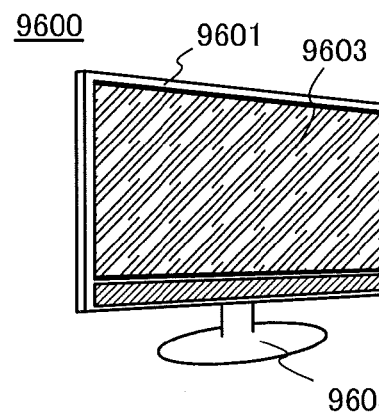

FIG. 16F illustrates an example of a television set. In a television set 9600, a display portion 9603 is incorporated in a housing 9601. The display portion 9603 can display images. Here, the housing 9601 is supported by a stand 9605. By applying the semiconductor device described in Embodiments 1 to 3, the television set 9600 can have high reliability.

The television set 9600 can be operated by an operation switch of the housing 9601 or a separate remote controller. Further, the remote controller may be provided with a display portion for displaying data output from the remote controller.

Note that the television set 9600 is provided with a receiver, a modem, and the like. With the use of the receiver, general television broadcasting can be received. Moreover, when the display device is connected to a communication network with or without wires via the modem, one-way (from a sender to a receiver) or two-way (between a sender and a receiver or between receivers) information communication can be performed.

This embodiment can be implemented in appropriate combination with the structures described in the other embodiments.

This application is based on Japanese Patent Application serial no. 2010-184642 filed with the Japan Patent Office on Aug. 20, 2010, the entire contents of which are hereby incorporated by reference.

What is claimed is:

1. A semiconductor device comprising:
    an oxide semiconductor layer;
    a first layer;
    a second layer over and in contact with the first layer; and
    a third layer over and in contact with the second layer,
    wherein the oxide semiconductor layer, the first layer, the second layer and the third layer overlap each other,
    wherein each of the first layer, the second layer and the third layer has a property of transmitting light in a wavelength $\lambda_0$,
    wherein optical thickness of the second layer is roughly an odd multiple of $\lambda_0/4$, and
    wherein a refractive index of the second layer is the highest or the lowest of the first layer, the second layer and the third layer.

2. The semiconductor device according to claim 1, wherein the oxide semiconductor layer is formed over a substrate.

3. The semiconductor device according to claim 1, wherein the second layer is an insulating layer.

4. The semiconductor device according to claim 1, wherein the second layer is a conductive layer.

5. The semiconductor device according to claim 1, wherein the wavelength $\lambda_0$ is a peak wavelength of a spectrum calculated by multiplying a spectral intensity of external light by a light absorption coefficient of the oxide semiconductor layer.

6. The semiconductor device according to claim 1, wherein the wavelength $\lambda_0$ lies within a range of from 300 nm to 450 nm.

7. A semiconductor device comprising:
    an oxide semiconductor layer;
    a first layer;
    a second layer over and in contact with the first layer; and
    a third layer over and in contact with the second layer,
    wherein the oxide semiconductor layer, the first layer, the second layer and the third layer overlap each other,
    wherein each of the first layer, the second layer and the third layer has a property of transmitting light in a wavelength $\lambda_0$, wherein optical thickness of the second layer is roughly an even multiple of $\lambda_0/4$,
wherein a refractive index of the second layer is higher than that of the first layer, and
wherein the refractive index of the second layer is lower than that of the third layer.

8. The semiconductor device according to claim 7, wherein the oxide semiconductor layer is formed over a substrate.

9. The semiconductor device according to claim 7, wherein the second layer is an insulating layer.

10. The semiconductor device according to claim 7, wherein the second layer is a conductive layer.

11. The semiconductor device according to claim 7, wherein the wavelength $\lambda_0$ is a peak wavelength of a spectrum calculated by multiplying a spectral intensity of external light by a light absorption coefficient of the oxide semiconductor layer.

12. The semiconductor device according to claim 7, wherein the wavelength $\lambda_0$ lies within a range of from 300 nm to 450 nm.

13. A semiconductor device comprising:
an oxide semiconductor layer;
a first layer;
a second layer over and in contact with the first layer;
a third layer over and in contact with the second layer;
a fourth layer over and in contact with the third layer,
wherein the oxide semiconductor layer, the first layer, the second layer, the third layer and the fourth layer overlap each other,
wherein each of the first layer, the second layer, the third layer and the fourth layer has a property of transmitting light in a wavelength $\lambda_0$,
wherein optical thickness of the second layer is roughly an odd multiple of $\lambda_0/4$,
wherein a refractive index of the second layer is the highest of the first layer, the second layer and the third layer,
wherein optical thickness of the third layer is roughly an even multiple of $\lambda_0/4$,
wherein a refractive index of the third layer is lower than that of the second layer, and
wherein the refractive index of the third layer is higher than that of the fourth layer.

14. The semiconductor device according to claim 13, wherein the oxide semiconductor layer is formed over a substrate.

15. The semiconductor device according to claim 13, wherein the second layer is an insulating layer.

16. The semiconductor device according to claim 13, wherein the second layer is a conductive layer.

17. The semiconductor device according to claim 13, wherein the wavelength $\lambda_0$ is a peak wavelength of a spectrum calculated by multiplying a spectral intensity of external light by a light absorption coefficient of the oxide semiconductor layer.

18. The semiconductor device according to claim 13, wherein the wavelength $\lambda_0$ lies within a range of from 300 nm to 450 nm.

19. A semiconductor device comprising:
an oxide semiconductor layer;
a first layer;
a second layer over and in contact with the first layer;
a third layer over and in contact with the second layer;
a fourth layer over and in contact with the third layer,
wherein the oxide semiconductor layer, the first layer, the second layer, the third layer and the fourth layer overlap each other,
wherein each of the first layer, the second layer, the third layer and the fourth layer has a property of transmitting light in a wavelength $\lambda_0$,
wherein optical thickness of the second layer is roughly an odd multiple of $\lambda_0/4$,
wherein a refractive index of the second layer is the lowest of the first layer, the second layer and the third layer,
wherein optical thickness of the third layer is roughly an even multiple of $\lambda_0/4$,
wherein a refractive index of the third layer is higher than that of the second layer, and
wherein the refractive index of the third layer is lower than that of the fourth layer.

20. The semiconductor device according to claim 19, wherein the oxide semiconductor layer is formed over a substrate.

21. The semiconductor device according to claim 19, wherein the second layer is an insulating layer.

22. The semiconductor device according to claim 19, wherein the second layer is a conductive layer.

23. The semiconductor device according to claim 19, wherein the wavelength $\lambda_0$ is a peak wavelength of a spectrum calculated by multiplying a spectral intensity of external light by a light absorption coefficient of the oxide semiconductor layer.

24. The semiconductor device according to claim 19, wherein the wavelength $\lambda_0$ lies within a range of from 300 nm to 450 nm.

* * * * *